US012306237B2

(12) United States Patent
Bohaichuk et al.

(10) Patent No.: US 12,306,237 B2
(45) Date of Patent: May 20, 2025

(54) DETECTING PHASE PROPERTIES OF RADIO FREQUENCY WAVES

(71) Applicant: Quantum Valley Ideas Laboratories, Waterloo (CA)

(72) Inventors: Stephanie M. Bohaichuk, Waterloo (CA); Harald Kubler, Waterloo (CA); Vijin Venu, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 18/825,561

(22) Filed: Sep. 5, 2024

(65) Prior Publication Data

US 2025/0085325 A1 Mar. 13, 2025

Related U.S. Application Data

(60) Provisional application No. 63/581,257, filed on Sep. 7, 2023.

(51) Int. Cl.
*G01R 29/08* (2006.01)
(52) U.S. Cl.
CPC ..... *G01R 29/0892* (2013.01); *G01R 29/0807* (2013.01); *G01R 29/0885* (2013.01)
(58) Field of Classification Search
CPC .......................... G01R 29/0885; G01R 29/0892
(Continued)

(56) References Cited

U.S. PATENT DOCUMENTS 10,509,065 B1 12/2019 Shaffer
10,564,201 B1 2/2020 Shaffer
(Continued)

FOREIGN PATENT DOCUMENTS

WO 2021243260 12/2021
WO 2023283581 1/2023

OTHER PUBLICATIONS

Anderson, David A., Rachel E. Sapiro, and Georg Raithel. "Rydberg atoms for radio-frequency communications and sensing: atomic receivers for pulsed RF field and phase detection." IEEE Aerospace and Electronic Systems Magazine 35.4 (2020): 48-56. (Year: 2020).*
(Continued)

*Primary Examiner* — Christopher P McAndrew
(74) *Attorney, Agent, or Firm* — Henry Patent Law Firm PLLC

(57) ABSTRACT

In a general aspect, a system is described herein for detecting the phase properties of a radio frequency (RF) wave. The system includes a vapor cell sensor that contains a vapor and is configured to generate an optical signal in response to laser signals that interact with the vapor. The vapor has a Rydberg electronic transition that interacts with a target RF electromagnetic field, and the optical signal is based on a transmission of one of the laser signals through the vapor. The system also includes an optical detection system and a signal processing system. The optical detection system is configured to generate a detector signal in response to receiving the optical signal, and the signal processing system is configured to receive the detector signal and perform operations that determine a phase change of the target RF electromagnetic field.

30 Claims, 10 Drawing Sheets

(58) Field of Classification Search
USPC .......................................................... 324/96
See application file for complete search history.

(56) References Cited

U.S. PATENT DOCUMENTS

| | | | |
|---|---|---|---|
| 10,605,840 | B1 | 3/2020 | Amarloo et al. |
| 10,823,775 | B2 | 11/2020 | Anderson et al. |
| 11,300,599 | B1 | 4/2022 | Amarloo et al. |
| 11,307,233 | B1 | 4/2022 | Amarloo et al. |
| 11,313,926 | B1 | 4/2022 | Amarloo et al. |
| 11,366,430 | B2 | 6/2022 | Ramirez-Serrano et al. |
| 11,435,234 | B1 | 9/2022 | Keaveney et al. |
| 11,592,469 | B2 | 2/2023 | Anderson |
| 11,658,461 | B1 | 5/2023 | Liu et al. |
| 11,681,016 | B1 * | 6/2023 | Bohaichuk ......... G01R 29/0892 342/195 |
| 11,874,311 | B1 * | 1/2024 | Dixon ................ G01R 29/0885 |
| 11,885,904 | B2 | 1/2024 | Bohaichuk et al. |
| 2016/0363617 | A1 * | 12/2016 | Anderson .......... G01R 29/0885 |
| 2019/0187198 | A1 * | 6/2019 | Anderson .......... G01R 29/0878 |
| 2020/0292606 | A1 * | 9/2020 | Holloway .......... G01R 29/0892 |
| 2021/0250101 | A1 * | 8/2021 | Gordon .................. H01Q 1/366 |
| 2022/0276293 | A1 * | 9/2022 | Compton ................. H04K 3/45 |
| 2022/0291268 | A1 * | 9/2022 | Anderson .......... G01R 29/0878 |
| 2023/0126884 | A1 * | 4/2023 | Ruster ..................... H01S 3/091 359/326 |
| 2023/0160938 | A1 * | 5/2023 | Ruster ................ G01R 29/0892 349/86 |
| 2023/0236233 | A1 * | 7/2023 | Jiao ........................ G01R 29/12 324/457 |
| 2023/0288465 | A1 * | 9/2023 | Fancher ................. G01R 29/14 |

OTHER PUBLICATIONS

Adams , et al., "Rydberg atom quantum technologies", J. Phys. B: At. Mol. Opt Phys. 53, Dec. 3, 2019, 14 pgs.

Bohaichuk, Stephanie M, et al., "A Three-Photon Rydberg Atom-Based Radio Frequency Sensing Scheme with Narrow Linewidth", arXiv:2304.07409 [physics.atom-ph] (2023), 2023, 11 pages.

Bohaichuk, Stephanie M, et al., "The Origins of Rydberg Atom Electrometer Transient Response and its Impact on Radio Frequency Pulse Sensing", arXiv:2203.01733, Mar. 3, 2022, 21 pgs.

Chakrapani, Arvind , "On the design details of SS/PBCH, Signal Generation and PRACH in 5G-NR", Chakrapani, Arvind (2020): On the design details of SS/PBCH, Signal Generation and PRACH in 5G-NR. TechRxiv. Preprint. https://doi.org/10.36227/techrxiv.12465743.v3, 2020, 23 pages.

Dixon, Katelyn , "Rydberg atom-based Electrometry Using a Self-Heterodyne Frequency Comb Readout and Preparation Scheme", Physical Review Applied 19, 034078 (2023)., 2023, 18 Pages.

Fan, Haoquan , et al., "Atom based RF electric field sensing", Journal of Physics B: Atomic, Molecular and Optical Physics 48 202001 (2015), Sep. 9, 2015, 17 pgs.

Fan, H Q , et al., "Dispersive radio frequency electrometry using Rydberg atoms in a prism-shaped atomic vapor cell", J.Phys. B: At. Mol. Opt. Phys. 49 (2016) 104004, 2016, 8 pgs.

Fan, Haoquan , et al., "Effect of Vapor-Cell Geometry on Rydberg-Atom-Based Measurements of Radio-Frequency Electric Fields", Physical Review Applied 4, 044015 (2015), 2015, 7 pgs.

Fan, H , et al., "Subwavelength microwave electric-field imaging using Rydberg atoms inside atomic vapor cells", Optics Letters, vol. 39, No. 10, 3030-3033, May 15, 2014, 4 pgs.

Kumar , et al., "Atom-Based Sensing of Weak Radio Frequency Electric Fields Using Homodyne Readout", Scientific Reports 7:42981, Feb. 20, 2017, 10 pgs.

Kumar , et al., "Rydberg-atom based radio-frequency electrometry using frequency modulation spectroscopy in room temperature vapor cells", Optics Express, vol. 25, No. 8, Apr. 17, 2017, 13 pgs.

Noaman, Mohammad , et al., "Rydberg-Atom Sensors in Bichromatic Radio-Frequency Fields", Phys. Rev. Applied 20, 024068 (2023)., 2023, 9 pages.

Noaman, M , et al., "Vapor Cell Characterization and Optimization for Applications in Rydberg Atom-Based Radio Frequency Sensing", Proceedings vol. 12447, Quantum Sensing, Imaging, and Precision Metrology; 124470V (2023), 2023, 6 pages.

Schmidt, Matthias , et al., "Rydberg atom-based radio frequency sensors: amplitude regime sensing", arXiv:2307.00121v1 [physics.atom-ph], retrieved on Jun. 30, 2023, 33 pages.

Sedlacek, J. , et al., "Atom Based Vector Microwave Electrometry Using Rubidium Rydberg Atoms in a Vapor Cell", arXiv: 1304.4299v1 [physics.atom-ph], Apr. 15, 2023, 5 pages.

Sedlacek, Jonathon A, et al., "Microwave electrometry with Rydberg atoms in a vapour cell using bright atomic resonances", Nature Physics, vol. 8, 819-824 (2012), Sep. 16, 2012, 6 pages.

Shaffer, J P, et al., "A read-out enhancement for microwave electric field sensing with Rydberg atoms", Proc. SPIE vol. 10674, Quantum Technologies 2018, 2018, 12 pgs.

ISA, International Search Report and Written Opinion issued in Application No. PCT/CA2024/051152 on Nov. 29, 2024, 9 pages.

ISA, International Search Report and Written Opinion issued in Application No. PCT/CA2024/051153 on Dec. 5, 2024, 8 pages.

* cited by examiner

DETECTING PHASE PROPERTIES OF RADIO FREQUENCY WAVES

CROSS-REFERENCE TO RELATED APPLICATIONS

This application claims priority to U.S. Prov. Pat. App. No. 63/581,257, which was filed on Sep. 7, 2023, and entitled, "Detecting a Phase of a Radio Frequency Wave." The disclosure of the priority application is hereby incorporated herein by reference in its entirety.

BACKGROUND

The following description relates to detecting phase properties of radio frequency (RF) waves.

A vapor cell sensor may include a vapor or gas within an enclosed volume, such as a volume defined by a chamber. The vapor or gas may be used as a medium to interact with RF electromagnetic radiation that is incident upon the vapor cell sensor. The vapor or gas may generate light in response to this interaction, and the light may be sensed to measure a response of the vapor or gas to the RF electromagnetic radiation. Beams of light, such as those generated by lasers, may also be directed through the vapor or gas to probe and measure the response of the vapor or gas to the RF electromagnetic radiation. In these ways, the vapor cell sensor may detect RF electromagnetic radiation, and in many instances, help to determine properties of the RF electromagnetic radiation.

DETAILED DESCRIPTION

Figure 1:
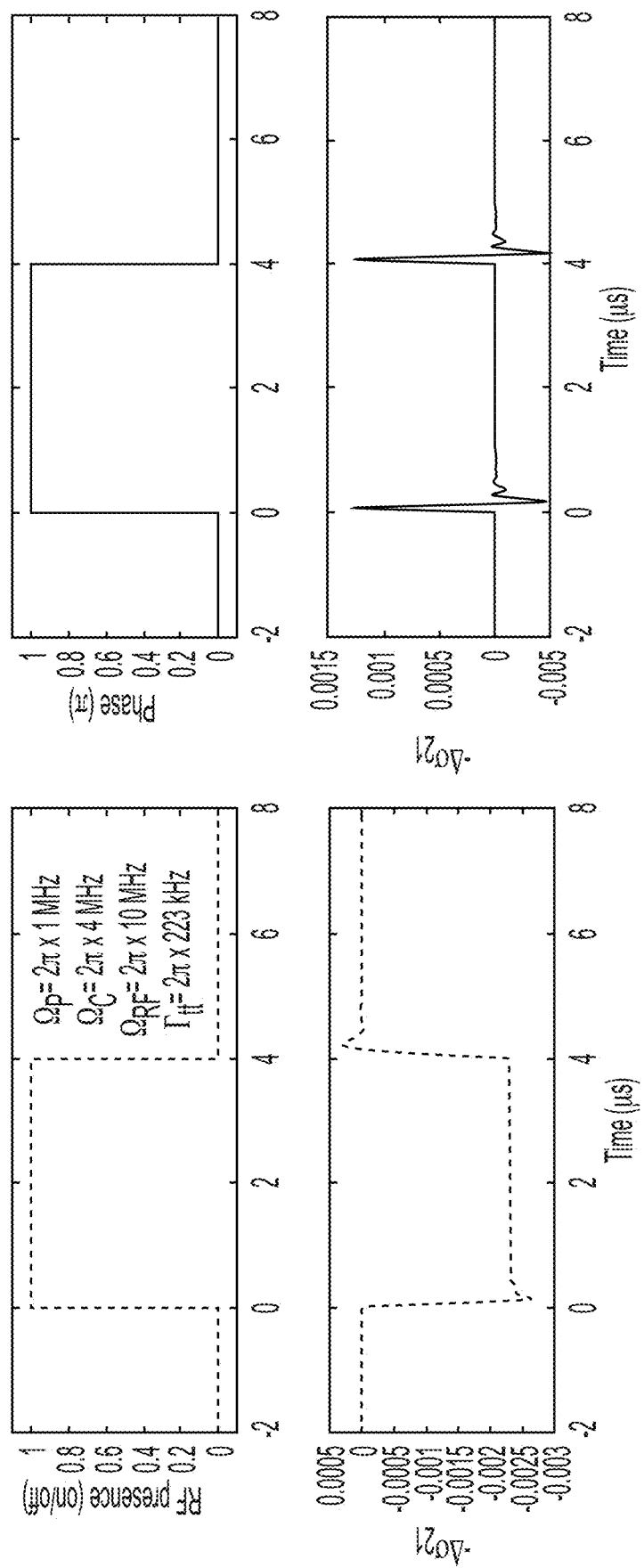
FIG. 1 is as series of graphs that show an example response of a two-laser EIT Rydberg vapor-based sensor, in simulation, to amplitude modulation (left) and phase modulation (right)

In a general aspect, systems and methods are described herein for detecting phase properties of a radio frequency (RF) wave. The phase properties may include, for example, one or both of a phase of the RF wave or a phase change of the RF wave. In some cases, the phase of the RF wave is based on a phase change of the RF wave that is detected relative to a reference phase. The systems and methods may include a vapor cell sensor that contains a vapor of Rydberg atoms or Rydberg molecules. In these configurations, the vapor cell sensor may be configured as a Rydberg vapor-based sensor. In many implementations, the systems and methods are configured to detect the phase properties of the RF wave using only optical signals, such as by using laser signals. The phase properties may correspond to the phase properties of a field component of the RF waves, such as an electric field of the RF wave. Moreover, in certain cases, the RF wave may be a pulsed RF wave, such as a time series of RF pulses. The optical signals may allow the phase properties to be detected at a high data rate (e.g., a rate no less than 1 MHz). In some implementations, the phase properties are detected together with amplitude properties, such as an amplitude of an RF pulse. The amplitude properties may correspond to the amplitude properties of a field component of the RF wave, such as an electric field of the RF wave.

To date, it is widely believed that Rydberg vapor-based sensors are square law detectors. This belief implies that the phase of an RF wave cannot be readily detected by a Rydberg vapor-based sensor without the use of a local RF oscillator, or alternatively, without constructing an interferometer that uses the internal structure of the atom or molecule (e.g., an "interferometer inside that atom" approach). Both methods have been proven to have a slow readout compared to the data rates expected for communication applications. The belief that Rydberg vapor-based sensors are square law detectors, however, only holds true if one understands their operation solely in the context of the steady state behavior of the vapor's response. In contrast, the transient behavior of the vapor can sense phase changes through the conversion of a phase response to an amplitude response.

The phase-to-amplitude conversion can occur because electromagnetically induced transparency (EIT) and electromagnetically induced absorption (EIA) are both coherent processes that depend on the phase of the driving fields, one of which is the field of the target RF wave. Under EIT or EIA conditions, a phase change of this latter field can cause a change in the probe laser transition polarization of the vapor. In other words, the change in the RF phase induces a change in the probe laser transmission. The transient response, which can induce both additional absorption and transmission, is due to the system equilibrating through optical pumping.

Under conditions where the absorption line is Lorentzian, like in a three-photon readout scheme, detuning of an optical signal (e.g., a probe or coupling laser signal) can be used to introduce a fixed phase output that allows full $2\pi$ phase detection. The analog of in-phase and quadrature (IQ) detection in conventional RF technology can be realized using detuning in a second vapor cell sensor, or a second channel (e.g., a second beam path) in the same vapor cell. For readout and preparation schemes where the response is Doppler limited, the phase is averaged more reducing this capability. However, the detection of the phase change is nevertheless preserved in the Doppler limited cases.

In some implementations, a system for detecting the phase of an RF wave may include one or more vapor cell sensors—e.g., a metrology vapor cell or a photonic crystal receiver—that are connected to a laser control system and a signal processing system. During operation, the signal processing system acquires a time dependent analog signal. Such acquisition may occur via principles of Rydberg vapor-based RF electric field sensing, and the frequency range may be, for example, between 1 MHz-300 GHz. The analog signal may be digitized and stored in a digital format. The digitized signal is then run through one or more matched filters to obtain both amplitude and phase information. Each of the matched filters may include a response template whose template data represents a known response of the vapor to a different reference RF pulse. The reference RF pulses may, for example, each represent an expected radar or communications pulse.

The phase information is carried in the transient signal from the one or more vapor cell sensors while the amplitude is associated with their steady-state signal. The matched filters can, in certain cases, be run in a massively parallel fashion using field programmable gate arrays (FPGAs) or graphics processing units (GPUs). Binary phase shift keying (BPSK) and even quadrature amplitude and phase (QAM) encodings are possible to readout with the system. For example, two sets of EIT/EIA lasers can pass through a single vapor cell sensor with one set detuned from resonance to add a phase shift of $\pi/2$. The two channels allow the in-phase (I) and out-of-phase (Q) components of the incoming RF wave to be detected in a single measurement (e.g., arbitrary phase and amplitude of the incoming RF wave). The repetition rates can be greater than 1 MHz, with sub-microsecond pulsing possible, which in turn can allow a readout of 5G-NR channels (e.g., up to 240 kHz maximum), particularly their synchronization channels. Phase encoded radar signals can also be detected. The use of the transient response of the vapor in the vapor cell sensor can significantly expand the applicability of Rydberg vapor-based sensors.

There are a great number of cases in RF engineering where one needs to determine a property of an RF wave, such as its power, frequency, or phase. For Rydberg vapor-based sensing, detection of phase properties with sufficient speed to meet communications and radar encoding timescales is an outstanding challenge. Workers in the field have utilized an RF reference—e.g., a local RF oscillator—to beat against a target RF wave. However, the readout of the signal has been slow, and generation of the RF local oscillator can limit the broad bandwidth otherwise offered by a Rydberg vapor-based sensor. Scattering of the RF wave on these sensors may also be increased and sacrifices the electromagnetic transparency of the technology. A second, but complicated solution is to construct an interferometer within the energy level structure of the vapor that can be sensitive to the phase of the target RF wave. Demonstrations of this solution, so far, have resulted in readout that is too slow to usefully detect phase modulation in radar or communications pulses. Moreover, this latter technique is complicated by the need to phase stabilize all the lasers involved in the detection process.

Some "interferometer inside the atom" approaches even utilize two-photon RF detection processes, which limit the sensitivity. However, these approaches all rely on the steady-state dynamics of the vapor after it is tailored for RF reception. In the steady state, the EIT or EIA processes used for conventional Rydberg vapor-based sensors are insensitive to phase, because Rydberg vapor-based sensors configured in this manner behave as a square law detector. In other words, they depend on the square root of the absolute square of a target RF electromagnetic field. They also require a local oscillator or reference to detect the phase.

EIT/EIA-like processes are coherent processes, and as such, depend on the relative phases of the driven off-diagonal elements of the density matrix describing the interaction process. The density matrix elements are complex valued, so when the vapor experiences a phase change, it must equilibrate to reach the steady state. In other words, the vapor adapts to the phase change. As a consequence, the transient response is sensitive to changes in phase of any of the fields interacting with the vapor. Because the laser fields are narrow bandwidth and can be stabilized to a reference, their phase is relatively stable, particularly in the case of a co-linear, Doppler-free, three-photon readout and preparation scheme. In this scheme, the EIT/EIA signal from the Rydberg vapor-based sensor is Lorentzian. The RF phase is also generally stable as demonstrated by its narrow spectral bandwidth.

If the RF wave changes its phase abruptly due to a phase encoding in the incoming wave, the RF wave induces a transient response in the vapor that can be used to determine the phase change. The systems and methods described herein utilize this effect to determine the phase properties of an RF wave, which in turn can allow the systems and methods to decode communication signals and radar signals that implement phase and amplitude encoding schemes. For example, the transient response may be utilized to decode phase modulated encoding schemes, such as a binary phase shift keying (BPSK) encoding scheme. The transient response may also be utilized to decode phase and amplitude modulated encoding schemes, such as a quadrature amplitude modulation (QAM) encoding scheme. Since the transient response is fast—e.g., on the scale of a pulse width and on the order of microseconds—and the signal is strong, this approach enables a fast readout of the phase properties (e.g., at times less than 1 µs). Such fast readout can allow real-time decoding of the incoming RF signal using digital signal processing after the analog photodetector output has been digitized.

FIG. 1 presents a series of graphs that show an example response of a two-laser EIT Rydberg vapor-based sensor, in simulation, to amplitude modulation (left) and phase modulation (right). The change in the probe laser density matrix element ($\Delta\sigma_{12}$) is shown in the lower pair of graphs. $\sigma_{12}$ is proportional to the dipole moment of the probe laser transition and therefore the absorption of the probe laser signal. The parameters for the calculations are shown in the inset of the upper left graph.

In FIG. 1, the upper left graph shows an example of a square RF pulse that has leading and trailing ends at 0 µs and 4 µs, respectively. The lower left graph shows the response of the vapor, as represented by $\Delta\sigma_{12}$, to the change in the amplitude at the leading and trailing ends. The response of the vapor has minimal overshoot and undershoot relative to an equilibrium value. In contrast, the upper right graph shows an example of a phase change in a pulsed RF wave (e.g., a time series of RF pulses) in which the phase of the pulsed RF wave changes by $+\pi$ (i.e., $+180°$) and $-\pi$ (i.e., $-180°$) at 0 µs and 4 µs, respectively. The lower right graph shows the response of the vapor, as represented by $\Delta\Delta_{12}$, to the change in phase at these times. However, the response of the vapor has notably larger overshoot and undershoot relative to equilibrium. This larger response indicates that the vapor experiences a transient response to each of the phase changes in the pulsed RF wave.

Figure 2:
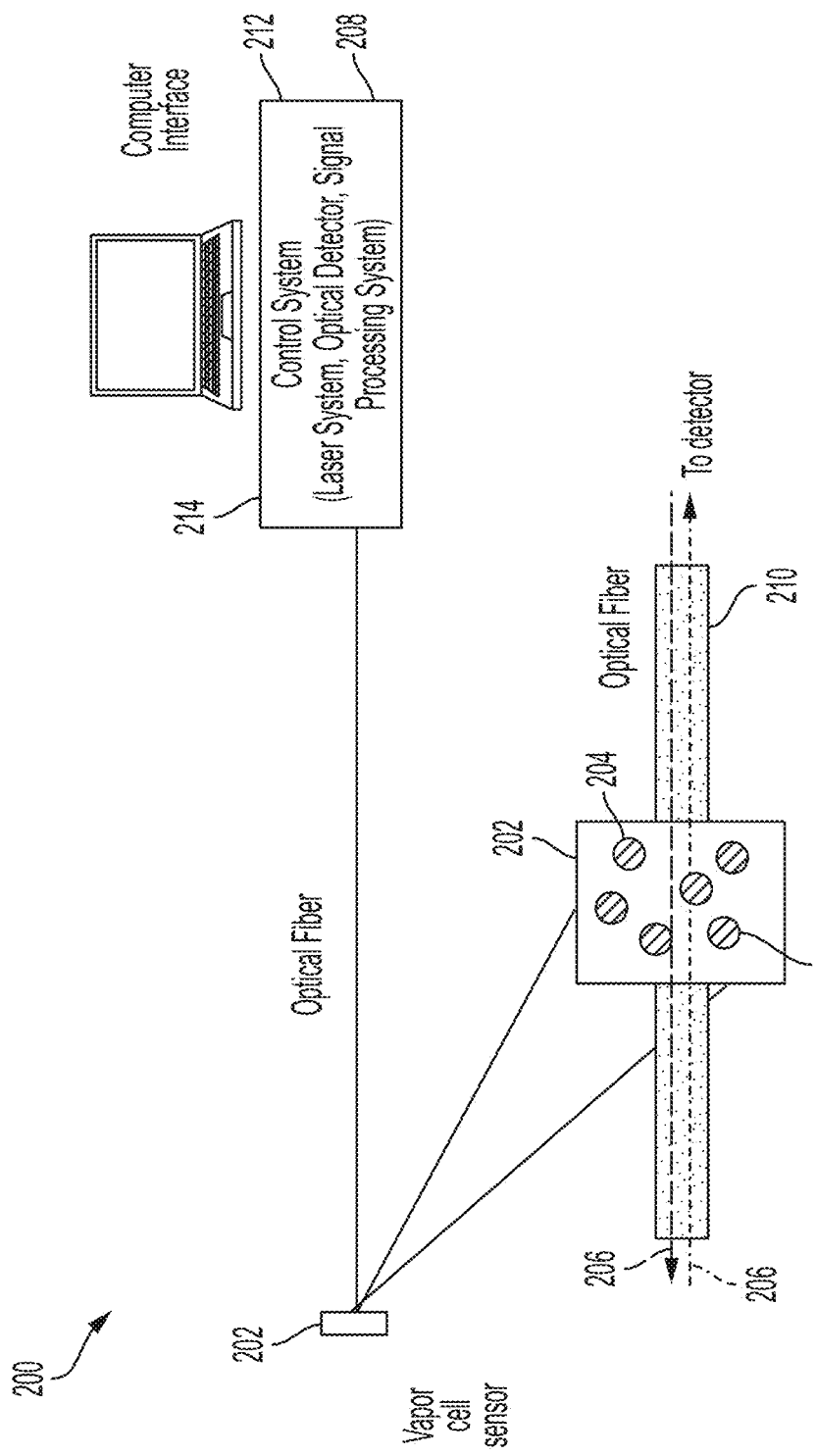
FIG. 2 is a schematic diagram of an example system for detecting a phase of an RF wave.

FIG. 2 presents a schematic diagram of an example system 200 for detecting the phase properties of an RF wave. The phase properties may include, for example, one or both of a phase of the RF wave or a phase change of the RF wave. The example system 200 includes a vapor cell sensor 202 that contains a vapor 204, and the phase properties of the RF wave may be detected using a transient response of the vapor 204 in the presence of two or more laser signals 206 (e.g., a probe laser signal and a coupling laser signal). Moreover, in many variations, the vapor cell sensor 202 is configured as a Rydberg vapor-based sensor. Example configurations of the vapor cell sensor can be found in U.S. Pat. No. 10,859,981 entitled "Vapor Cells Having One or More Optical Windows Bonded to a Dielectric Body" and U.S. Pat. No. 11,137,432 entitled "Photonic Crystal Receivers".

The vapor 204 may include a gas of Rydberg atoms, a gas of Rydberg molecules, or both. Examples of Rydberg atoms include alkali metal atoms (e.g., from Group IA of the periodic table). Examples of Rydberg molecules include halogen molecules (e.g., from Group VIIA of the periodic table) or organic molecules. Other Rydberg atoms and Rydberg molecules are possible. In some variations, the vapor 204 includes constituents such as a gas of alkali metal atoms, a noble gas, a gas of diatomic halogen molecules, a gas of organic molecules, or some combination thereof. For example, the vapor 204 may include a gas of alkali-metal atoms (e.g., Na, K, Rb, Cs, etc.), a noble gas (e.g., He, Ne, Ar, Kr, etc.), or both. As another example, the vapor 204 may include a gas of diatomic halogen molecules (e.g., $F_2$, $Cl_2$, $Br_2$, $I_2$, etc.), a noble gas, or both. In still another example, the vapor 204 includes a gas of organic molecules (e.g., acetylene), a noble gas, or both. Other combinations are possible for the vapor, including different constituents.

In some implementations, the example system 200 includes a laser system 208 and an optical detector. The laser system 208 is configured to generate the two or more laser signals 206, and the optical detector may be configured to generate detector signals in response to receiving an optical signal from the vapor cell sensor 202. The optical detector may be optically coupled to the vapor cell sensor via an optical fiber 210. The example system 200 may also include a signal processing system 212 that is configured to receive the detector signals from an optical detector. In certain cases, as shown in FIG. 2, the laser system 208, the optical detector, and the signal processing system 212 may be part of a control system 214 of the example system 200.

In some implementations, the example system 200 includes two or more vapor cell sensors 202, and in certain cases, may also include groups of laser systems 208. During operation, the two or more vapor cell sensors 202 can be utilized to obtain IQ data from the RF wave. In some variations, the signal processing system 212 is configured to process the detector signals in an analog domain. In some variations, the signal processing system 212 is configured to convert the detector signals from an analog domain to a digital domain and then process the converted signals digitally. Such conversion can provide significant advantages, especially when the signal processing system includes massively parallel circuitry (e.g., an FPGA, a GPU, etc.).

In some implementations, the example system 200 is operated in conjunction with an agile laser system, such as described in U.S. Pat. No. 11,658,461 entitled "Tuning the Output of a Laser". The agile laser system may, in certain cases, be a part of the laser system 208. In these implementations, the example system 208 may be configured to provide secure communications. For example, a communication signal can be encoded on two or more different carrier frequencies where it is necessary to receive multiple signals to decode the message. Another use might be in signal redundancy, which may be used to eliminate or reduce the risk of a communication signal being jammed.

The phase detection provided by the example system 200 is advantageous because phase and amplitude modulation are used to encode information in RF communications. BPSK is a robust example, where the amplitude of the wave is constant, but information is encoded using phase shifting by x (e.g., 180°). To more densely encode signals, another possibility is to use quadrature amplitude modulation (QAM). In 5G New Radio (5G NR) communications, the synchronization signal that identifies beam and channel information uses BPSK encoding because it is robust. The synchronization signal lasts about 5 ms and is followed by a variable, but approximately 15-ms window where a signal is encoded. The signal encoding is done using QAM. The fastest channel rate is 240 kHz, using pulses of about 4.1 µs in temporal length. Other radar and communications protocols are similar as they are based on conventional RF technology.

Rydberg vapor-based sensors can operate as square law detectors in the steady state. In other words, they can be insensitive to phase. However, this insensitivity does not carry over into their transient state. The phase change of a target RF field can lead to a change in the interference phenomena that are used to dress the vapor constituents (e.g., atoms) so that they are sensitive to the target RF field, as well as readout the target RF field. When the phase of the target RF field changes, the transmission, or analogously the absorption, of a laser signal through the vapor (e.g., a probe laser signal) will exhibit large changes, as shown in the lower right side of FIG. 1. The changes can be of the same size as an amplitude modulated RF field, as shown in the lower left side of FIG. 1. The magnitude of the signal depends on the strength of the RF field and its phase. The phase change and the amplitude can both be used for encoding signals for applications like communications. The fact that the phase can be detected in this way is very useful because it provides an all-optical method for detecting phase properties. In other words, the detection of phase (including a change thereof) does not require a local RF oscillator. Additionally, in many variations, the laser configuration can be the same as that used for a standard EIT/EIA based Rydberg vapor-based sensor. As such, there are no additional lasers necessary. Moreover, phase stabilization of the lasers is not required beyond that for a standard Rydberg vapor-based sensor.

In some implementations, a three-photon readout method may provide additional advantages for detecting the phase of the target RF field (including a phase change of the target RF field). The signal in the three-photon readout does not suffer from the Doppler averaging, which in some instances, can suppress certain phase effects. Moreover, with the three-photon readout method, it may be possible to run two or more sensing channels that have a fixed phase relationship. This fixed phase relationship allows the method to obtain full $2\pi$ phase information of the target RF field, similar to IQ methods in conventional electronics. Examples of IQ methods are described further in relation to FIG. 4. In the colinear three-photon readout method, the detuning from resonance of one channel is fixed within the spectral line shape of the EIT/EIA resonance. This fixed detuning sets a phase offset and is then compared to the signal on-resonance or at another fixed detuning. The two measurements determine the two measurement vectors in the complex amplitude-phase plane. Moreover, the two measurement vectors, when determined, can be used to measure the full phase angle.

Figure 3A:
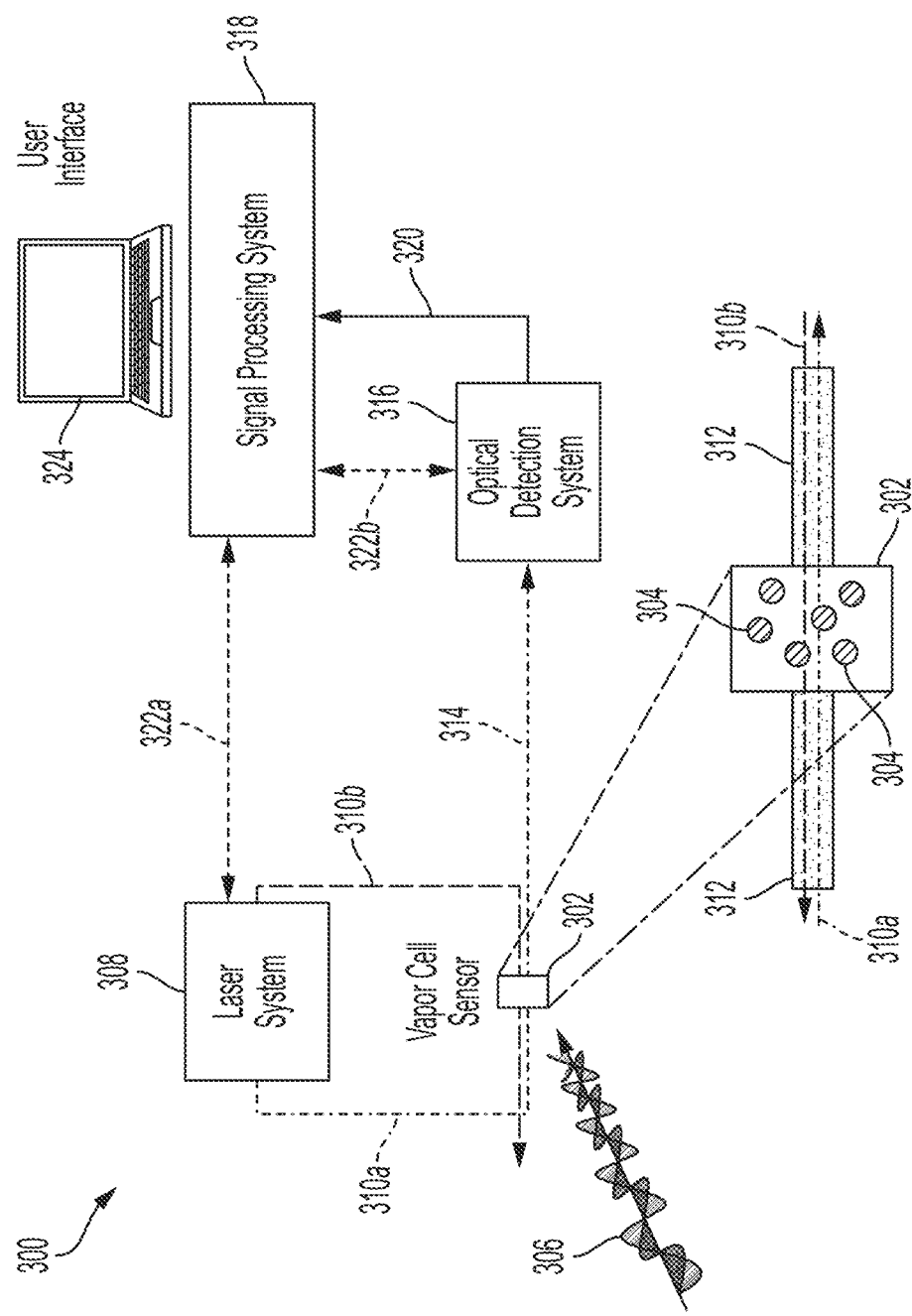
FIG. 3A is a schematic diagram of an example system that includes a vapor cell sensor.
Figure 3B:
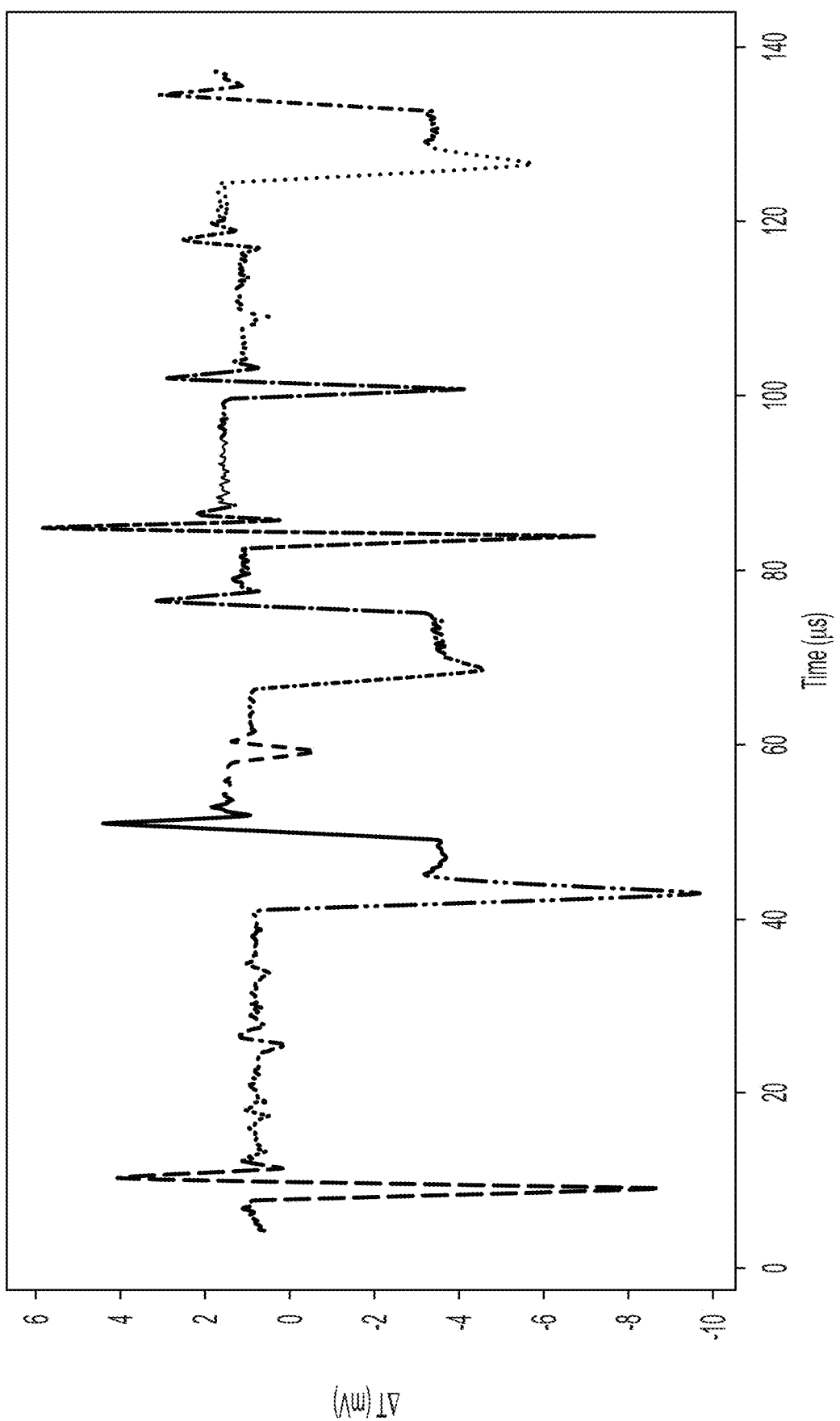
FIG. 3B is a graph showing an example of a time series of RF pulses in which each RF pulse has one or both of an amplitude and a phase.

Now referring to FIG. 3A, a schematic diagram is presented of an example system 300 that includes a vapor cell sensor 302. The example system 300 may be analogous to the example system 200 of FIG. 2 and may be configured to measure the phase properties of an RF wave, such as the phase properties of a time series of RF pulses. The vapor cell sensor 302 contains a vapor 304 having electronic states, such as Rydberg electronic states. The vapor 304 may, for example, include one or both of a vapor of Rydberg atoms (e.g., Rb, Cs, etc.) and a vapor of Rydberg molecules (e.g., $H_2$, $I_2$, etc.). In these cases, the vapor cell sensor 302 may be a Rydberg vapor-based sensor. In many implementations, the vapor 304 includes a Rydberg electronic transition that interacts with a target RF electromagnetic field 306, such as one that includes a time series of RF pulses. FIG. 3B presents a graph of an example of a time series of RF pulses in which each RF pulse has one or both of an amplitude and a phase. The time series of RF pulses includes multiple pairs of consecutive RF pulses. If a pair of consecutive RF pulses differ in phase, the time series of RF pulses may experience a phase change when transitioning between the pair of consecutive RF pulses. If the pair of consecutive RF pulses differ in amplitude (e.g., differ in electric field amplitude), the time series of RF pulses may experience a change in amplitude when transitioning between the pair of consecutive RF pulses.

Figure 3C:
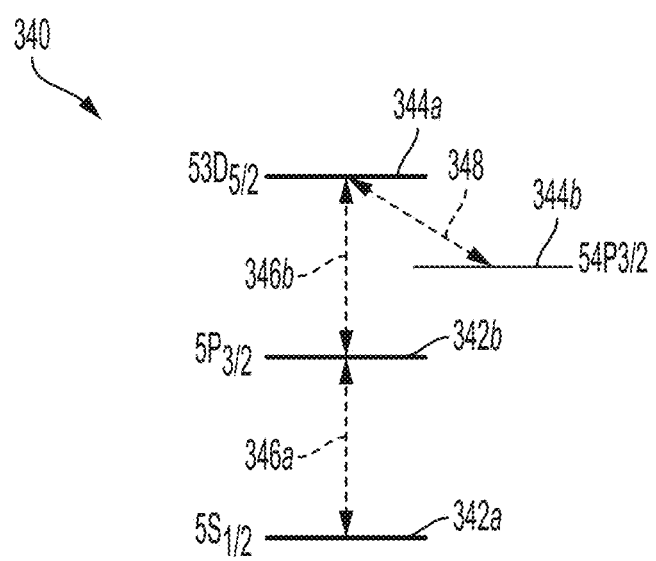
FIG. 3C is a schematic diagram of an example set of electronic states for a vapor of Rb atoms.

In some implementations, the vapor 304 includes a plurality of electronic states that define a ladder of electronic states. For example, FIG. 3C presents a schematic diagram of an example set of electronic states 340 for a vapor of Rb atoms. The example set of electronic states 340 includes first and second electronic states 342a, 342b and first and second Rydberg electronic states 344a, 344b. These states are labeled in FIG. 3C using spectroscopic notation—i.e., $5S_{1/2}$, $5P_{3/2}$, $53D_{3/2}$, and $54P_{3/2}$, respectively—that is applicable to Rb atoms. The first electronic state 342a, the second electronic state 342b, and the first Rydberg electronic state 344a are progressively higher in energy and define a ladder of electronic states. Moreover, the second Rydberg electronic state 344b is lower in energy than the first Rydberg electronic state 344a. However, in some implementations, the second Rydberg electronic state 344b may be higher in energy than the first Rydberg electronic state 344a.

The example set of electronic states 340 defines electronic transitions of the vapor of Rb atoms. For example, the energy gap between the first and second electronic states 342a, 342b define a first optical electronic transition 346a. Similarly, the energy gap between the second electronic state 342b and the first Rydberg electronic state 344a defines a second optical electronic transition 346b. The first and second optical electronic transitions 346a, 346b may interact with (e.g., absorb) optical signals, such as laser signals from a laser system. In some variations, the first and second optical electronic transitions 346a, 346b correspond to probe and coupling optical transitions. In these variations, probe and coupling laser signals may be used to interact with, respectively, the first and second optical electronic transitions 346a, 346b. As another example, the energy gap between the first and second Rydberg electronic states 344a, 344b may define a Rydberg electronic transition 348 that interacts with (e.g., absorbs) a target RF electromagnetic field (e.g., the target RF electromagnetic field 306 of FIG. 3A). In doing so, the first and second optical electronic transitions 346a, 346b may allow the vapor of Rb atoms to be used with a two-photon readout method that is based on two laser signals (e.g., probe and coupling laser signals).

Figure 3D:
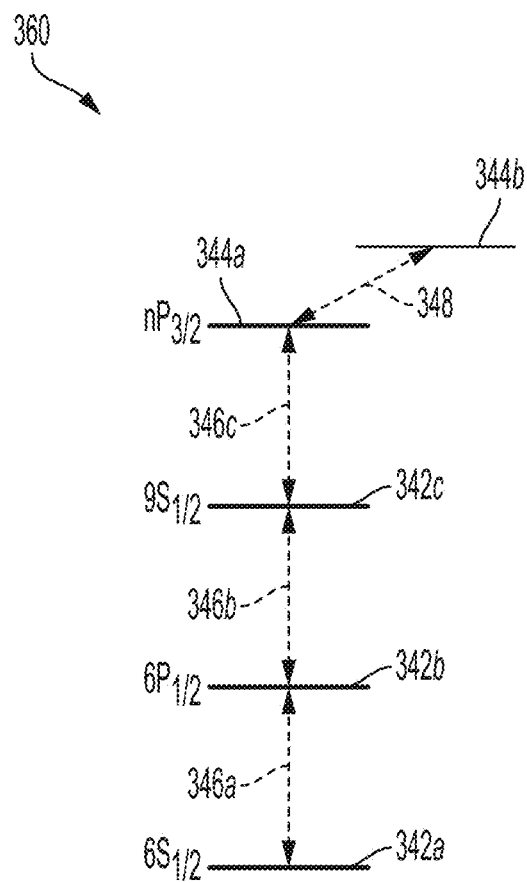
FIG. 3D is a schematic diagram of an example set of electronic states for a vapor of Cs atoms.

In FIG. 3C, the example set of electronic states 340 is depicted as having four electronic states, with two being Rydberg electronic states. However, other numbers and combinations of electronic states and Rydberg electronic states are possible. For example, FIG. 3D presents a schematic diagram of an example set of electronic states 360 for a vapor of Cs atoms. The example set of electronic states 360 includes a third electronic state 342c such that the first electronic state 342a, the second electronic state 342b, the third electronic state 342c, and the first Rydberg electronic state 344a are progressively higher in energy (e.g., define a ladder of electronic states). The energy gap between the second and third electronic states 342b, 342c defines a third optical electronic transition 346c that is configured to interact with (e.g., absorb) optical signals. In some variations, the first optical electronic transition 346a corresponds to a probe optical transition, and the second and third optical electronic transitions 346b, 346c correspond to first and second coupling optical transitions. In these variations, a probe laser signal may be used to interact with the probe optical transition, and first and second coupling laser signals may be used to interact with, respectively, the second and third optical electronic transitions 346b, 346c. In FIG. 3D, the second Rydberg electronic state 344b is higher in energy than the first Rydberg electronic state 344a. However, in some implementations, the second Rydberg electronic state 344b may be lower in energy than the first Rydberg electronic state 344a. In some variations, the first, second, and third optical electronic transitions 346a, 346b, 346c may allow the vapor of Rb atoms to be used with a three-photon readout method that is based on three laser signals (e.g., a probe laser signal and two coupling laser signals). In some variations, the first optical electronic transition 346a in FIG. 3D corresponds to a probe optical transition, and the second and third optical electronic transitions 346b, 346c in FIG. 3D correspond to first and second coupling optical transitions, respectively.

Now referring back to FIG. 3A, the example system 300 also includes a laser system 308 that is optically coupled to the vapor cell sensor 302, such as through free space or through an optical fiber assembly. The laser system 308 is configured to generate laser signals 310 that are transmitted to the vapor cell sensor 302. For example, the laser system 308 may generate a probe laser signal 310a and a coupling laser signal 310b that are guided by optical fibers 312 to interact with the vapor 304 of the vapor cell sensor 302. FIG. 3A depicts two laser signals 310 defined by, respectively, probe and coupling laser signals 310a, 310b. However, other numbers of laser signals 310 are possible (e.g., one probe laser signal and two coupling laser signals). FIG. 3A also depicts the laser signals 310 as counter-propagating through the vapor 304 along opposing optical paths. However, other configurations of optical paths are possible (e.g., parallel propagation), including other numbers of optical paths. Examples of configurations of laser signals and their interactions with Rydberg vapors are described further in U.S. Pat. No. 10,509,065 entitled "Imaging of Electromagnetic Fields".

In some implementations, the vapor cell sensor 302 generates an optical signal 314 in response to receiving the laser signals 310. The optical signal 314 may be based on one of the laser signals 310 after interacting with (e.g., passing through) the vapor 304. For example, the optical signal 314 may be defined by the probe laser signal 310a after passing through the vapor 304 and while the coupling laser signal 310b also interacts the vapor 304. In this case, the probe and coupling laser signals 310a, 310b may interact together within the target volume of the vapor 304. The optical signal 314 may thus be based on a transmission of the probe laser signal 310a through the vapor 304. In many variations, the vapor cell sensor 302 is configured to generate the optical signal 314 while the target RF electromagnetic field 306 interacts with the vapor 304. In these variations, the target RF electromagnetic field 306 interacts with the Rydberg electronic transition of the vapor 304 and alters an intensity of the optical signal 314.

In some implementations, the example system 300 additionally includes an optical detection system 316 and a signal processing system 318. The optical detection system 316 is optically coupled to the vapor cell sensor 302 to receive the optical signal 314, such as through free space or through an optical fiber assembly. The optical detection system 316 is configured to generate a detector signal 320 in response to receiving the optical signal 314, and the detector signal 320 may represent an intensity of the optical signal 314 (e.g., an intensity of the probe laser signal 310*a* after passing through the vapor 304). The intensity may be based on an optical property of the optical signal 314. For example, the optical detection system 316 may include a photodetector that is configured to generate a detector signal in response to measuring an intensity of the optical signal 314 at a specific frequency or a specific range of frequencies. As another example, the optical detection system 316 may include a polarizer such that the photodetector measures an intensity of the optical signal 314 at a specific polarization. Combinations of optical properties are possible.

The optical detection system 316 may include one or more optical elements (e.g., lenses, mirrors, polarizers, filters, gratings, beam splitters, etc.) that can be controlled to manipulate the optical signal 314. Such manipulation may allow the optical detection system 316 to measure a target optical property of the optical signal 314, such as via a photodetector. In some implementations, the optical detection system 316 includes a photodetector configured to measure a target optical property of the optical signal 314, such as an intensity of the optical signal 314 at a specific frequency or a specific range of frequencies. In these implementations, the optical detection system 316 may include multiple photodetectors, each configured to measure a different target property of the optical signal 314 (e.g., multiple intensities at different, respective frequencies). In some implementations, the optical detection system 316 may include an optical spectrum analyzer to measure the intensity of the optical signal 314 across multiple frequencies.

The signal processing system 318 may include subsystems such as a signal processing unit, a data processing unit (e.g., a computer), a power control unit, a network interface, and so forth. In some implementations, the signal processing system 318 is configured to receive the detector signal 320 from the optical detection system 316 and may include analog electronics, digital electronics, or both, for processing the detector signal 320 once received. The signal processing system 318 may also be configured to generate response data that represents a response of the vapor 304 to the laser signals 310 and the target RF electromagnetic field 306. For example, the signal processing system 318 may include one or more processors (e.g., CPUs, GPUs, ASICs, FPGAs, etc.) and a memory (e.g., DRAM, flash memory, etc.). The memory may store instructions, that, when executed by the one or more processors, is configured to perform operations that include generating, based on the detector signal 320, response data that represents a response of the vapor 304 to the laser signals 310 and the target RF electromagnetic field 306. The operations also include determining, based on the response data, an interval during which the vapor 304 experiences a transient response to the target RF electromagnetic field 306. The interval is associated with a phase change in the time series of RF pulses. The operations additionally include determining a magnitude of the phase change based on a portion of the response data that is generated during the interval.

In some implementations, the example system 300 includes a communication channel 322*a* between the signal processing system 318 and the laser system 308. The communication channel 322*a* may be defined, for example, by a wired connection (e.g., an Ethernet connection) or a wireless connection (e.g., a WiFi connection). The example system 300 may also include a power channel (e.g., an electrical power cable) between the signal processing system 318 and the laser system 308. In these implementations, the signal processing system 318 may be configured to control the laser system 308, thereby allowing the signal processing system 318 to control an optical property of one or more of the laser signals 310 generated by the laser system 308. Such control may include altering or maintaining the optical property, and examples of the optical property include an amplitude (e.g., an intensity), a frequency, a polarization, and a phase of the one or more laser signals 310. Combinations of optical properties are possible.

In some implementations, the example system 300 includes a communication channel 322*b* between the signal processing system 318 and the optical detection system 316. The communication channel 322*b* may be defined, for example, by a wired connection (e.g., an Ethernet connection) or a wireless connection (e.g., a WiFi connection). The example system 300 may also include a power channel (e.g., an electrical power cable) between the signal processing system 318 and the optical detection system 316. In these implementations, the signal processing system 318 may be further configured to control the optical detection system 316, thereby allowing the optical detection system 316 to measure a property of the optical signal 314, such as an intensity of the optical signal 314. Such control may include controlling optical elements of the optical detection system 316 to select a target optical property of the optical signal 314 (e.g., a frequency of the optical signal 314, a polarization of the optical signal 314, etc.). Such control may also include controlling one or more photodetectors, each configured to measure a different target optical property.

In some implementations, the signal processing system 318 includes a computer that provides a user interface 324 for the example system 300. Examples of the computer include a desktop computer, a workstation, a server, a laptop, a tablet, a mobile device, and so forth. The user interface 324 is configured to allow a user of the example system 300 to view and manipulate the response data. However, other functionality is possible (e.g., controlling the laser system 308 and the optical detection system 316; displaying information related to the laser system 308 and the optical detection system 316; etc.). In some implementations, the optical detection system 316 is configured to generate analog signals and the signal processing system 318 is configured to convert the analog signals into digital signals for processing. In these implementations, the signal processing system 318 may include circuits for parallel processing of the digital signals (e.g., FPGAs, ASICS, GPUs, etc.).

During operation of the example system 300, the laser system 308 generates the laser signals 310. For example, the laser system 308 may generate the probe and coupling laser signals 310*a*, 310*b*, which in turn, interact with the vapor 304 of the vapor cell sensor 302. In some instances, the probe laser signal 310*a* interacts with a probe optical transition of the vapor 304 (e.g., the first optical electronic transition 346*a* in FIGS. 3C and 3D). Similarly, the coupling laser signal 310*b* interacts with a coupling optical transition of the vapor 304 (e.g., the second optical electronic transition 346*b* in FIGS. 3C and 3D). In response to the laser signals 310, the vapor cell sensor 302 generates the optical signal 314. The optical signal 314 is based on a transmission of one of the laser signals 310 through the vapor 304. For example, the probe laser signal 310a may exit the vapor 304 after the probe laser signal 310a and the coupling laser signal 310b interact with the electronic states of the vapor 304. As such, the optical signal 314 may be based on the transmission of the probe laser signal 310a through the vapor 304.

During operation of the example system 300, the target RF electromagnetic field 306 may also interact with the vapor 304 of the vapor cell sensor 302. In doing so, the target RF electromagnetic field 306 may alter an intensity of the optical signal 314 by interacting with the Rydberg electronic transition of the vapor 304 (e.g., the Rydberg electronic transition 348 in FIGS. 3C and 3D). Such alteration may occur through a physical process of electromagnetically induced transparency (EIT) or electromagnetically induced absorption (EIA). The optical detection system 316 then receives the optical signal 314 and generates the detector signal 320 in response. The detector signal 320 represents an intensity of the optical signal 314, such as an intensity of the probe laser signal 310a after passing through the vapor 304. The intensity of the optical signal 314 may be based on an optical property of the optical signal 314. For example, the optical detection system 316 may measure the intensity of the optical signal 314 at a specific frequency or a specific range of frequencies. As another example, the optical detection system 316 may measure the intensity of the optical signal 314 at a specific polarization. Combinations of optical properties are possible.

The signal processing system 318 receives the detector signal 320 from the optical detection system 316 and performs operations that include generating, based on the detector signal 320, response data that represents a response of the vapor 304 to the laser signals 310 and the target RF electromagnetic field 306. In some implementations, the operation of generating the response data includes generating values for respective elements of a density matrix that represents a response of the vapor 304 to the laser signals 310 and the target RF electromagnetic field 306. The values of the respective elements may, in certain cases, be generated using a model that incorporates the density matrix.

For example, and with reference to FIG. 3C, the response of the vapor 304 can be modeled using a 5-level system that represents the electronic states 340 for a vapor of Rb atoms. A density matrix simulation of the response of the vapor 304 can then be performed using the 5-level system. The density matrix simulation may follow the time-dependent master equation shown in Equation (1):

$$\dot{\rho} = \frac{i}{\hbar}[\rho, H] + \mathcal{L}(\rho), \quad (1)$$

where H is the Hamiltonian of the system, ρ is the density matrix, $\mathcal{L}$ is the Lindblad operator, and $\hbar$ is the reduced Planck's constant. The first four levels in the 5-level system correspond to the electronic states shown in FIG. 3C, with |1⟩ referring to the ground state (e.g., the first electronic state 342a), |2⟩ to the intermediate excited state (e.g., the second electronic state 342b), |3⟩ to the Rydberg excited state (e.g., the first Rydberg electronic state 344a), and |4⟩ to the excited state coupled to by the target RF electromagnetic field 306 (e.g., the second Rydberg electronic state 344b). The fifth level |5⟩ corresponds to a "dark" electronic state that represents atomic states populated through one or more of a Rydberg-Rydberg collision, a radiative decay, a black-body radiation, and an ionization. The fifth level |5⟩ is not optically coupled to the primary system. However, this level may help to model the time series of RF pulses in the target RF electromagnetic field 306. For instance, the fifth level |5⟩ may help to model the time scales of the RF pulses in the time series, especially on a trailing edge of an RF pulse. The Hamiltonian of the 5-level system may be represented by the following density matrix:

$$H = \hbar \begin{pmatrix} 0 & \frac{\Omega_p}{2} & 0 & 0 & 0 \\ \frac{\Omega_p}{2} & -\Delta_2 & \frac{\Omega_c}{2} & 0 & 0 \\ 0 & \frac{\Omega_c}{2} & -\Delta_3 & \frac{\Omega_{RF}(t)}{2} & 0 \\ 0 & 0 & \frac{\Omega_{RF}(t)}{2} & -\Delta_4 & 0 \\ 0 & 0 & 0 & 0 & 0 \end{pmatrix}. \quad (2)$$

In Equation (2), $\Omega_p$, $\Omega_c$, and $\Omega_{RF}(t)$ are the Rabi frequencies of the probe laser signal 310a, the coupling laser signal 310b, and the target RF electromagnetic field 306, respectively. During the density matrix simulation, the target RF electromagnetic field 306 is set during an initial time to off ($\Omega_{RF}=0$) so that the simulation can reach equilibrium. The target RF electromagnetic field 306 is subsequently turned on for the duration of an RF pulse, which can include a finite rise and fall time of the RF pulse. The detuning of state |2⟩ is given by $\Delta_2=-\Delta_P+k_P v$ and the detuning of state |3⟩ is given by $\Delta_3=-\Delta_P-\Delta_C+(k_P-k_C)v$, with both probe and coupling laser signals 310a, 310b locked on resonance so $\Delta_P=\Delta_C=0$. Here, $k_P$ and $k_c$ are the wavevectors of, respectively, the probe and coupling laser signals 310a, 310b, while v is the atomic or molecular velocity along a direction of the probe laser signal 310a that is used to account for Doppler shifts. The Doppler shift of the RF wave (e.g., the target RF electromagnetic field 306) may be ignored because it has a much longer wavelength than the laser signals 310. However, Doppler shifts can be included in the calculations if necessary.

The Lindblad operator $\mathcal{L}$ can account for the decay and the dephasing of the electronic states of the Rb atoms. $\Gamma_{21}=2\pi\times6.1$ MHz may be used as a well-known decay rate from $5P_{3/2}$ to $5S_{1/2}$ (e.g., from the second electronic state 342b to the first electronic state 342a), and $\Gamma 32$ as a radiative decay rate from the Rydberg exited state to the excited state (e.g., from the first Rydberg electronic state 344a to the second Rydberg electronic state 344b). In the example model, the rates $\Gamma_{31}=\Gamma_{41}=\Gamma_{51}$ are fitted to experiment and represent a transit time through the beams of the laser signals 310, with Rb atoms in the |3⟩, |4⟩, and |5⟩ states being replaced by ground state |1⟩ Rb atoms once they drift out of the beams. Finally, $\Gamma_{35}$ represents a generation rate for atoms and/or ions in the "dark" state |5⟩, arising primarily through Rydberg-Rydberg collisions. This rate can be implemented as a fixed average value or a time-varying rate that depends on the population of the Rydberg electronic states. The decay from state |4⟩ can also be explicitly included, but its values are small for the example case, so during the density matrix simulation, the decay and dephasing from level |4⟩ may be ignored. Density matrix simulations and their application to detecting RF pulses are described further in U.S. Pat. No. 11,885,904 entitled "Sensing Pulses of Radio Frequency Fields".

During operation of the example system 300, the operations of the signal processing system 318 may also include determining, based on the response data, an interval during which the vapor 304 experiences a transient response to the target RF electromagnetic field 306. The interval is associated with a phase change in the time series of RF pulses. For example, the upper right graph of FIG. 1 shows an example of two phase changes in a time series of RF pulses, i.e., a phase change of $+\pi$ (i.e., $+180°$) and $-\pi$ (i.e., $-180°$) at 0 μs and 4 μs, respectively. The lower right graph shows an example of a transient response of the vapor 304 to each of the two phase changes, as represented by $\Delta\sigma_{12}$. As such, the signal processing system 318 may use the response data to determine a first interval about 0 μs and a second interval about 4 μs. The first and second intervals may contain, respectively, the first and second transient responses of the vapor 304.

In determining the first and second intervals, the signal processing system 318 may rely on a metric, such as a magnitude of the response data, a rate of change of the response data, and so forth. In some instances, the metric may be based on statistical analysis of the response data. In some instances, the metric may be based on one or more elements of a density matrix. For example, the operation of determining the interval may include determining a start and an end of the interval based on a magnitude of an element of the density matrix, such as a magnitude of an off-diagonal element of the density matrix, $\sigma_{12}$. In these cases, the signal processing system 318 may generate values of $\Delta\sigma_{12}$ over time, and the oscillation of $\Delta\sigma_{12}$ may then be compared against measured portion of the response data—e.g., a portion of the response data based on the detector signal 320—to determine the start and the end of the interval. The lower right graph of FIG. 1 shows two examples of oscillations for $\Delta\sigma_{12}$ at about 0 μs and 4 μs, respectively.

As another example, the operation of determining the interval may include determining a decay rate of an element of the density matrix, such as a decay rate of $\sigma_{12}$. The decay rate may represent a transition of the vapor 304 from a transient response to the target RF electromagnetic field 306 to a steady-state response to the target RF electromagnetic field 306. In these cases, the signal processing system 318 may generate values of $\Delta\sigma_{12}$ over time, and the decay rate of $\Delta\sigma_{12}$ may then be compared against the measured portion of the response data to determine the interval. The lower right graph of FIG. 1 shows two examples of $\Delta\sigma_{12}$ decaying to an equilibrium value (e.g., zero) shortly after the vapor 304 experiences the $+\pi$ and $-\pi$ phase changes in the time series of RF pulses at about 0 μs and 4 μs, respectively.

During operation of the example system 300, the operations of the signal processing system 318 may additionally include determining a magnitude of the phase change based on a portion of the response data that is generated during the interval. In some instances, the magnitude of the phase change may be used to further determine a phase of the time series of RF pulses. For example, the operations of the signal processing system 318 may include identifying, based on the interval, a transition between two consecutive RF pulses in the time series of RF pulses. The two consecutive RF pulses may be defined by, for instance, a target RF pulse and a previous RF pulse. The operations of the signal processing system 318 may then further include determining a phase of the target RF pulse based on the magnitude of the phase change and a phase of the previous RF pulse. The phase of the previous RF pulse may be already known, such as by being previously determined by the signal processing system 318. However, in certain cases, the previous RF pulse may be part of one or more initializing RF pulses that establish a reference phase for the time series of RF pulses. In these cases, the phase of the previous RF pulse may be the reference phase. In some instances, the phase of the time series of RF pulses is used by the signal processing system 318 to assign a symbol to the target RF pulse based. The symbol may be part of a plurality of symbols of a communication protocol, such as a binary phase shift keying (BPSK) protocol, a quadrature amplitude modulation (QAM) protocol, or some other type of communication protocol.

In some implementations, the signal processing system 318 may determine one or both of the interval and the magnitude of the phase change using a response template. For example, the time series of RF pulses may share a pulse period in common, such as for an RF communication signal. In these cases, the operation of determining the interval may include generating a sampled portion of response data by sampling the response data over a sampling period that is based on the pulse period. Such sampling may occur as the response data is generated by the signal processing system 318 in response to receiving the detector signal 320 or at a later point in time when the response data is stored in a memory of the signal processing system 318. Moreover, the sample period may have a length, in time, that is defined by a single pulse period or a multiple number of pulse periods depending on the size of the response data to be sampled. The operation of determining the interval may also include comparing the sampled portion of response data to each of a plurality of response templates to determine respective degrees of fit. Each response template includes template data that represents a known response of the vapor 304 to a different reference RF pulse. The signal processing system 318 may then select one of the response templates based on its degree of fit and proceed to determine the interval based on the sampled portion of response data and the template data of the selected response template. To determine the magnitude of the phase change, the signal processing system 318 may, in some variations, proceed to determine the magnitude of the phase change based on the portion of the response data that is generated during the interval as well as the template data of the selected response template.

In some implementations, the signal processing system 318 may compare the sampled portion of response data to a response template by generating a difference. For example, comparing the sampled portion of response data may include generating, for each response template, a difference between the template data of the response template and the sampled portion of response data. The difference may define the degree of fit for the response template. In these cases, the signal processing system 318 may one of the response templates by identifying an individual response template that has a minimum difference between its template data and the sampled portion of response data. The individual response template defines the selected response template.

In some implementations, comparing the sampled portion of response data to each of a plurality of response templates may include applying, by operation of the signal processing system 318, a correlation function to the sampled portion of response data. The correlation function may improve the detection of weak RF pulses as well as improve the signal-to-noise ratio (SNR) of the processed response data. The correlation function may also help in extracting a known RF pulse shape from white noise in the sampled portion of response data. Convolution function may, in certain cases, be represented by a convolution of a noisy waveform, $p_{data}(t)$, with a time-reversed expected pulse template, $p_{temp}(t)$. Equation (3) below shows a mathematical example of the convolution function, MF (t):

$$MF(t) = \int_{-\infty}^{\infty} p_{data}(s) p_{temp}(s + t_{pulse} - t) ds. \quad (3)$$

In some instances, Equation (3) is discretized to use on a processor of the signal processing system 318 (e.g., an FPGA). A peak value for MF (t) corresponds to the point of maximum cross-correlation between an expected RF pulse shape and the sampled portion of the response data. The peak may therefore allow the signal processing system 318 to identify the pulse arrival time, $t_{arrival}$ and the pulse length, $t_{pulse}$ of the extracted RF pulse. In some variations, the pulse length, $t_{pulse}$, serves as a period of the response template for the convolution function. The point of maximum cross-correlation may allow the properties of the extracted RF pulse to be determined from noisy response data, such as by reference to the response template. Such properties include a start time of the RF pulse, an end time of the RF pulse, a duration of the RF pulse, an amplitude of the RF pulse, and so forth.

In implementations where the signal processing system 318 uses a plurality of response templates, the signal processing system 318 may, in certain cases, also use the plurality of response templates to assign a symbol to a target RF pulse in the time series of RF pulses. For example, the plurality of response templates may be associated with respective symbols of a communication protocol. In these cases, the signal processing system 318 may identify, based on the interval, a transition between two consecutive RF pulses in the time series of RF pulses. The two consecutive RF pulses may be defined by the target RF pulse and a previous RF pulse. The signal processing system 318 may then assign the symbol of the selected response template to the target RF pulse.

In some implementations, the plurality of response templates are associated with different sequences of reference RF pulses. This configuration of the response templates may allow the signal processing system 318 to process the time series of RF pulses in groups (as opposed to single RF pulses). As such, the signal processing system 318 may experience a reduced processing burden and may also be able to process the time series of RF pulses faster. For example, the time series of RF pulses may share a pulse period in common, such as when part of an RF communication signal. Moreover, the interval may be an extended interval during which the vapor 304 experiences two or more transient responses to the target RF electromagnetic field 306. In these cases, the extended interval may include two or more sub-intervals that are associated with respective phase changes in the time series of RF pulses. The signal processing system 318 may then determine the interval by performing operations that include generating a sampled portion of response data by sampling the response data over a sampling period that is based on a multiple number of pulse periods. The operations may also include comparing the sampled portion of response data to each of the plurality of response templates to determine respective degrees of fit. Here, each response template has template data that represents a known response of the vapor 304 to a different sequence of reference RF pulses. The operations may then additionally include selecting one of the response templates based on its degree of fit as well as determining the extended interval based on the sampled portion of response data and the template data of the selected response template.

In these implementations, the signal processing system 318 may determine the magnitude of the phase change, in whole or in part, by determining a magnitude of each phase change associated with the two or more sub-intervals. To do so, the signal processing system 318 may determine the magnitude of each phase change based on an extended portion of the response data that is generated during the extended interval as well as the template data of the selected response template. In some variations, the plurality of response templates may also be associated with respective sequences of symbols that are part of a communication protocol. The communication protocol may be, for example, a BPSK protocol, a QAM protocol, or some other type of communication protocol. In these variations, the time series of RF pulses include a sequence of RF pulses in the extended interval. The signal processing system 318 may then assign the sequence of symbols of the selected response template to the sequence of RF pulses.

During operation, the example system 300 may determine the amplitude properties of the time series of RF pulses in addition to its phase properties. To do so, the signal processing system 318 may process a portion of the response data that is associated with a steady-state response of the vapor 304 to the target RF electromagnetic field 306. The steady-state response of the vapor 304 may occur after the transient response of the vapor 304 to the target RF electromagnetic field 306. For example, the interval may be a first interval, and the portion of the response data associated with the transient response may be a first portion of the response data. In these cases, the operations of the signal processing system 318 may include determining, based on the response data, a second interval during which the vapor 304 experiences the steady-state response to the target RF electromagnetic field 306. The signal processing system 318 may then determine an amplitude of a target RF pulse in the time series of RF pulses based on a second portion of the response data that is generated during the second interval.

In some implementations, the signal processing system 318 uses the determined amplitude to assign a symbol to an RF pulse in the time series of RF pulses. The determined amplitude may be used in combination with a phase of one of the time series of RF pulses. For example, the signal processing system 318 may determine a magnitude of a phase change in the time series of RF pulses. The phase change occurs between the target RF pulse and a previous RF pulse in the time series of RF pulses. The target RF pulse and the previous RF pulse may correspond to two consecutive RF pulses in the time series of RF pulses. In these cases, the signal processing system 318 may determine a phase of the target RF pulse based on the magnitude of the phase change and a phase of the previous RF pulse. The signal processing system 318 may then assign a symbol to the target RF pulse based on the determined phase and the determined amplitude. The symbol is part of a plurality of symbols of a communication protocol, such as a QAM protocol.

In certain cases, the target RF pulse may include a first RF sub-pulse and a second RF sub-pulse that can assist the signal processing system 318 in assigning the symbol to the target RF pulse. For example, the first RF sub-pulse may represent one or both of a phase change and an amplitude change of the target RF pulse relative to, respectively, a sub-pulse reference phase and a sub-pulse reference amplitude. The sub-pulse reference phase and the sub-pulse reference amplitude may, in some instances, correspond to a reference phase and a reference amplitude the time series of RF pulses, respectively. In doing so, the first RF sub-pulse may serve as an initializing sub-pulse that provides one or both of reference phase and amplitude information to the signal processing system 318. The initializing sub-pulse may be associated with an initialization symbol that is part of the plurality of symbols of the communication protocol. The first RF sub-pulse may also allow the signal processing system 318 to mitigate errors in the time series of RF pulses prior to the target RF pulse (e.g., errors introduced in RF pulse prior to the target RF pulse). The second RF sub-pulse may represent one or both of a phase change and an amplitude change of the target RF pulse relative to, respectively, the phase and the amplitude of the previous RF pulse. As such, the second RF sub-pulse may assist the signal processing system 318 in determining the phase change of the target RF pulse as well as its amplitude. The signal processing system 318 may then assign a symbol to the target RF pulse based on the determined phase and the determined amplitude. The symbol may be a message symbol that is part of the plurality of symbols of the communication protocol.

In general, the presence of the first and second RF sub-pulses may allow each pulse cycle in the time series of RF pulses to be uncorrelated with previous pulse cycles. However, the presence of the first and second RF sub-pulses can, in some instances, increase the processing burden of the signal processing system 318. To reduce or eliminate this effect, the target RF pulse may complement the first RF sub-pulse with multiple instances of the second RF sub-pulse. For example, the target RF pulse may include the first RF sub-pulse and three instances of the second RF sub-pulse. This configuration may allow the signal processing system 318 to assign a single initialization symbol and three message symbols to the target RF pulse. The three instances of the second RF sub-pulse may represent different phase changes and amplitude changes of the target RF pulse, and as such, the three message symbols may be different from each other.

In some implementations, the signal processing system 318 may use a plurality of response templates to determine the amplitude properties of the time series of RF pulses in conjunction with its phase properties. For example, the time series of RF pulses may share a pulse period in common, such as when part of an RF communication signal. In these cases, the signal processing system 318 may determine the second interval by generating a sampled portion of response data by sampling the response data over a sampling period that is based on the pulse period. Such sampling may occur as the response data is generated by the signal processing system 318 in response to receiving the detector signal 320 or at a later point in time when the response data is stored in a memory of the signal processing system 318. Moreover, the sample period may have a length, in time, that is defined by a single pulse period or a multiple number of pulse periods depending on the size of the response data to be sampled. The signal processing system 318 may also compare the sampled portion of response data to each of a plurality of response templates to determine respective degrees of fit. Each response template has template data that represents a known response of the vapor 304 to a different reference RF pulse. The signal processing system 318 may then additionally select one of the response templates based on its degree of fit and then determine the second interval based on the sampled portion of response data and the template data of the selected response template. In some instances, signal processing system 318 may determine the amplitude of the target RF pulse based on the template data of the selected response template and the second portion of the response data that is generated during the second interval.

In some implementations, the plurality of response templates are associated with different sequences of reference RF pulses. In these implementations, the signal processing system 318 may use the plurality of response templates to determine the phase and amplitude properties of a target sequence of RF pulses. This configuration of the response templates may allow the signal processing system 318 to process the time series of RF pulses in groups (as opposed to single RF pulses). As such, the signal processing system 318 may experience a reduced processing burden and may also be able to process the time series of RF pulses faster.

For example, the time series of RF pulses may share a pulse period in common, and the interval may be an extended interval during which the vapor 304 experiences one or more transient responses and one or more steady-state responses to the target RF electromagnetic field. In these cases, the extended interval may include one or more first sub-intervals that are associated with respective phase changes in the target sequence of RF pulses. The extended interval may also include one or more second sub-intervals that are associated with respective amplitudes of the target sequence of RF pulses. As such, the signal processing system 318 may determine the extended interval by generating a sampled portion of response data by sampling the response data over a sampling period that is based on a multiple number of pulse periods. In some instances, the multiple number of pulse periods may be based on a length of the target sequence of RF pulses in time. The signal processing system 318 may also compare the sampled portion of response data to each of a plurality of response templates to determine respective degrees of fit. Each response template has template data that represents a known response of the vapor to a different sequence of reference RF pulses. The signal processing system 318 may then select one of the response templates based on its degree of fit and determine the extended interval based on the sampled portion of response data and the template data of the selected response template.

In some instances, the signal processing system 318 may determine the magnitude of each phase change associated with the one or more first sub-intervals based on the template data of the selected response template and an extended portion of the response data that is generated during the extended interval. The signal processing system 318 may also determine each amplitude associated with the one or more second sub-intervals based on the extended portion of the response data and the template data of the selected response template. In some instances, the plurality of response templates are associated with respective sequences of symbols that are part of a communication protocol, such as such as a QAM protocol. In these instances, the signal processing system 318 may assign the sequence of symbols of the selected response template to the target sequence of RF pulses.

During operation, the signal processing system 318 may send control signals to the laser system 308 to alter a frequency of one of the laser signals 310. The altered frequency may assist the signal processing system 318 in determining a sign of the phase change (e.g., as opposed to an absolute magnitude of the phase change). In altering the frequency of the one laser signal, the laser system 308 may detune the one laser signal relative to an optical electronic transition of the vapor 304. For example, and with reference to FIG. 3C, the laser system 310 may generate a probe laser signal (e.g., probe laser signal 310a) that interacts with the first optical electronic transition 346a of the vapor 304 (e.g., a vapor of Rb atoms). The probe laser signal may have a frequency that is on resonance with the first optical electronic transition 346a. More specifically, the first optical electronic transition 346a may have a quantum energy difference that corresponds to a precise laser frequency (e.g., 384.349 THz), and the probe laser signal may have a frequency that matches this precise laser frequency. In these cases, the signal processing system 318 may send a control signal to the laser system 308 to increase or decrease the frequency of the probe laser signal by a target amount (e.g., 100 MHz), thereby detuning the probe laser signal relative to the first optical electronic transition 346a.

In some implementations, the operations of the signal processing system 318 include transmitting a control signal to the laser system 308 to alter a frequency of one of the laser signals, thereby producing a detuned laser signal whose frequency is detuned relative to an optical electronic transition of the vapor 304. In these implementations, the optical signal 314 from the vapor cell sensor 302 is based on a transmission of the detuned laser signal through the vapor 304, and the response data includes detuned response data that represents the response of the vapor 304 when the laser signals 310 include the detuned laser signal. The signal processing system 318 may then, and as part of determining the magnitude of the phase change, determine a sign of the phase change based on the detuned response data.

In some implementations, the signal processing system 318 may transmit control signals to the laser system 308 to alter the frequencies of a pair of the laser signals 310. In doing so, the signal processing system 318 may establish a symmetrical or asymmetrical detuning about an optical electronic transition of the vapor 304. For example, and with reference to FIG. 3C, the laser system 310 may generate first and second coupling laser signals that interact with the second optical electronic transition 346b of the vapor 304 (e.g., a vapor of Rb atoms). The first coupling laser signal may be detuned by a target amount (e.g., +100 MHz) relative to the second optical electronic transition 346b, and the second coupling laser signal may be detuned by an equal, but opposite amount (e.g., −100 MHz) relative to the second optical electronic transition 346b. In these cases, the signal processing system 318 establishes a symmetrical detuning about the second optical electronic transition 346b. In contrast, the first coupling laser signal may be detuned by a target amount (e.g., +80 MHz) relative to the second optical electronic transition 346b, and the second coupling laser signal may be detuned by an unequal, but opposite amount (e.g., −50 MHz) relative to the second optical electronic transition 346b. In such latter cases, the signal processing system 318 establishes an asymmetrical detuning about the second optical electronic transition 346b.

In some implementations where the laser system 308 receives a control signal to produce a detuned laser signal, the detuned laser signal may be a first detuned laser signal, and the control signal is a first control signal. In these implementations, the signal processing system 318 may transmit a second control signal to the laser system 308 to produce a second detuned laser signal. The second detuned laser signal is detuned relative to an optical electronic transition of the vapor 304, and in many instances, is detuned simultaneously with the first detuned laser signal. Moreover, the detuned response data represents the response of the vapor 304 when the laser signals 310 include the first and second detuned laser signals. In some instances, the first and second detuned laser signals are detuned symmetrically about the optical electronic transition of the vapor 304. In other instances, the first and second detuned laser signals are detuned asymmetrically about the optical electronic transition of the vapor 304.

In some implementations, the laser system 308 may be configured to generate a laser signal that has a plurality of laser signal sub-components, such as a comb laser signal. The laser signal sub-components may have respective detunings relative to an optical electronic transition of the vapor 304, and these detunings may allow the signal processing system 318 to process multiple phase changes, sometimes simultaneously.

For example, the laser signals 310 may include a probe laser signal (e.g., probe laser signal 310a) that has comb lines at respective comb frequencies. The comb lines may represent different respective detunings of the probe laser signal relative to a probe optical transition of the vapor 304. In these cases, the optical signal 314 is based on a transmission of the probe laser signal through the vapor 304, and the detector signal 320 represents an intensity of the optical signal 314 at two or more comb frequencies that are associated with respective target comb lines of the probe laser signal. As such, and as part of generating response data, the signal processing system 318 may generate a subset of response data for each target comb line of the probe laser signal.

In some instances, the respective target comb lines of the probe laser signal may include first and second target comb lines. For example, the first target comb line may have a first detuning of 0 MHz (e.g., be on resonance), and the second target comb line may have a second detuning of +100 MHz. Other combinations of detuning magnitudes are possible (e.g., symmetric detunings, asymmetric detunings, etc.). In these instances, the signal processing system 318 may, and as part of determining the interval, determine a first interval for the first target comb line based on a first subset of response data that is generated for the first target comb line. The first interval is associated with a first phase change in the time series of RF pulses. The signal processing system 318 may also determine a second interval for the second target comb line based on a second subset of response data that is generated for the second target comb line. The second interval is associated with a second phase change in the time series of RF pulses. The first and second intervals may allow the signal processing system 318 to determine the magnitudes of, respectively, the first and second phase changes. The operation of determining the magnitude of the phase change may therefore include determining a magnitude of the first phase change based on a portion of the first subset of response data that is generated during the first interval. The operation of determining the magnitude may also include determining a magnitude of the second phase change based on a portion of the second subset of response data that is generated during the second interval. In some instances, the respective target comb lines of the probe laser signal include additional target comb lines (e.g., a third target comb line, a fourth target comb line, etc.) that are processed by the signal processing system 318 along with the first and second target comb lines.

As another example, the laser signals 310 may include a probe laser signal (e.g., probe laser signal 310a) and a coupling laser signal (e.g., coupling laser signal 310b), and the coupling laser signal may have comb lines at respective comb frequencies. In this example, the comb lines represent different respective detunings of the coupling laser signal relative to a coupling optical transition of the vapor. Moreover, the optical signal 314 includes optical sub-signals that are associated with respective comb lines of the coupling laser signal, and the optical sub-signals are based on a transmission of the probe laser signal through the vapor 304 as the respective comb lines of the coupling laser signal interact with the vapor 304. In these cases, two or more of the optical sub-signals may be associated with respective target comb lines of the coupling laser signal. Each of the two or more optical sub-signals have an intensity, and the detector signal 320 represents the intensities of two or more optical sub-signals. As such, and as part of generating response data, the signal processing system 318 may generate a subset of response data for each target comb line of the coupling laser signal.

In some instances, the time series of RF pulses is a first time series of RF pulses, and the target RF electromagnetic field 306 may include a second time series of RF pulses. In such instances, the first and second time series of RF pulses may have different carrier frequencies. Moreover, the respective target comb lines of the coupling laser signal include first and second target comb lines that are associated with, respectively, the first and second time series of RF pulses. The signal processing system 318 may then, and as part of determining the interval, determining a first interval for the first target comb line based on a first subset of response data that is generated for the first target comb line. The first interval is associated with a first phase change in the first time series of RF pulses. The signal processing system 318 may also determine a second interval for the second target comb line based on a second subset of response data that is generated for the second target comb line. The second interval is associated with a second phase change in the second time series of RF pulses. The first and second intervals may allow the signal processing system 318 to determine the magnitudes of, respectively, the first and second phase changes. The operation of determining the magnitude of the phase change may therefore include determining a magnitude of the first phase change based on a portion of the first subset of response data that is generated during the first interval. The operation of determining the magnitude may also include determining a magnitude of the second phase change based on a portion of the second subset of response data that is generated during the second interval. In some instances, the respective target comb lines of the coupling laser signal include additional target comb lines (e.g., a third target comb line, a fourth target comb line, etc.) that are processed by the signal processing system 318 along with the first and second target comb lines.

Figure 4:
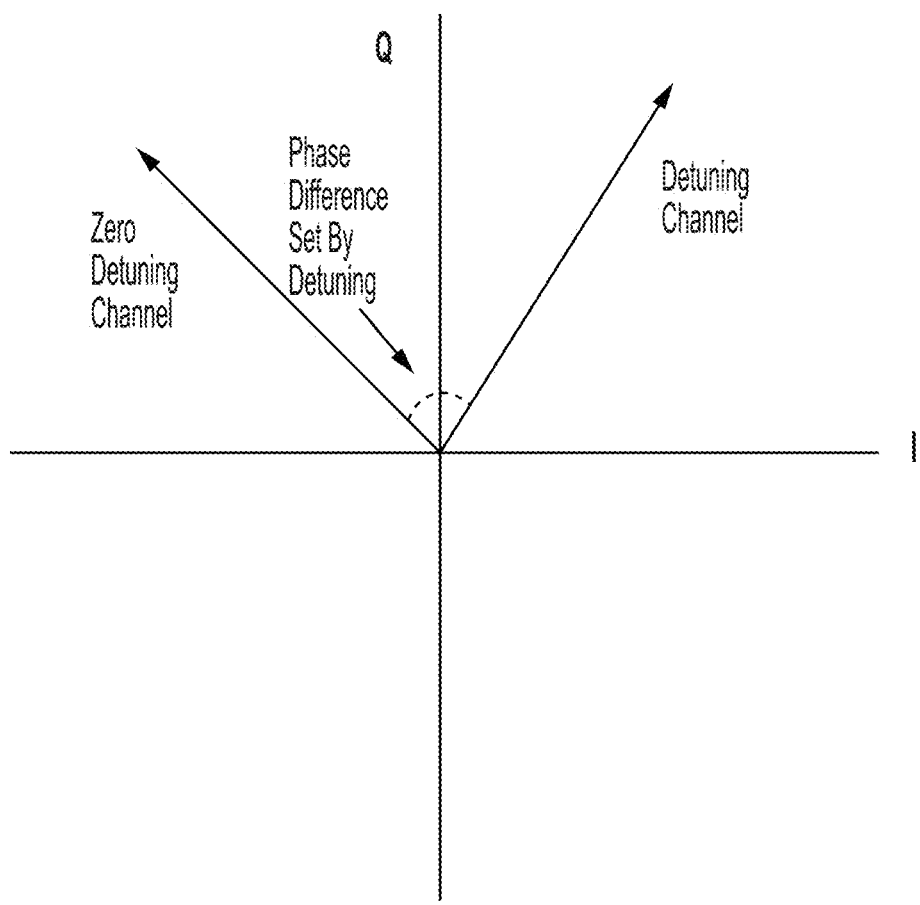
FIG. 4 is a schematic diagram of an example $2\pi$ phase detection in which in-phase (I) and quadrature (Q) signals are detected.

The example systems 200, 300 of FIGS. 2 and 3A can read out a time-dependent signal, such as a time series of RF pulses. In some variations, the detector signal is an analog optical detector signal that, in many instances, is converted to a digital signal. The digital signal is processed to determine the phase, and possibly also the amplitude, from the transient and steady-state response of the vapor in the vapor cell sensor. For example, the transient response is used to detect the phase of the target RF wave while steady-state response is used to determine the amplitude. Variants that implement detuning to apply known phase shifts, such as with a colinear three-photon readout, can function slightly differently. For instance, they can give a phase relative to a fixed reference phase. This latter approach can yield IQ data in a single measurement, such as shown in FIG. 4. FIG. 4 presents a schematic diagram of an example 2π phase detection in which in-phase (I) and quadrature (Q) signals are detected. The schematic diagram includes a graph that shows how a detuned measurement at a fixed phase can help to determine the "sign" of the phase of a target RF wave.

In some implementations, the example systems 200, 300 are configured to process communications and radar signals that are phase and amplitude encoded. Examples of such signals include 5G NR signals, especially primary synchronization signals (PSS), secondary synchronization signals (SSS), and pass band channel (PBCH) signals. These signals can be used to evaluate base station performance and diagnose base station health. In these implementations, the example systems 200, 300 may also be configured to decode radar signal phase encoding, such as to evaluate a return pulse and obtain Doppler shift information.

In some implementations, a system for detecting phase properties of an RF wave includes a laser system, a signal processing system, a user interface, and at least one vapor cell sensor that is coupled via waveguide (e.g., a fiber optic cable) to the laser system and the signal processing system. The system may be analogous to the example systems 200, 300 described in relation to FIGS. 2 and 3A-3D. The vapor cell sensor can have a mounting system and can include virtually any type of vapor cell. For example, the vapor cell sensor may be a metrology vapor cell that is configured for test and measurement applications. As another example, the vapor cell sensor may be a photonic crystal receiver that is configured for radar applications.

The laser system may include at least two lasers that are configured for Rydberg atom-based sensing. For example, the laser system may include probe and coupling lasers that are configured to generate, respectively, probe and coupling laser signals. The vapor cell sensor is configured to receive these signals, and in response, output an optical signal. As part of this process, the probe and coupling laser signals may interact with electronic transitions of the vapor and these transitions may alter one or both of a transmission (e.g., via EIT) and an absorption (e.g., EIA) of the probe laser signal. As such, the optical signal can be generated using EIT or EIA. Examples of such a process are described further in U.S. Pat. No. 10,509,065 entitled "Imaging of Electromagnetic Fields".

In some implementations, a sub-Doppler method is useful for higher spectral resolution in the Autler-Townes regime and higher sensitivity. The less a Doppler shift affects the system, the better the phase readout. In some variations, the colinear three-photon readout method may be superior for phase readout. In some variations, the lasers of the laser system may be locked to a stable, narrow bandwidth reference such as a frequency comb, interferometer, or atomic or molecular absorption line. To read out the optical signal from the vapor cell sensor, either of the lasers can be scanned or the probe laser can be used to generate a frequency comb in an optical heterodyne or homodyne setup. If a frequency comb is used, a real-time spectrum analyzer can be used to detect the signal. In the case of a frequency comb, it is not necessary to scan either of the laser systems to readout the signal, although it is possible to use a combination of scanning and a frequency comb. Frequency comb readout can sense multiple phases set by detuning simultaneously. An electro-optic modulator can be used to introduce multiple frequencies with fixed detunings (e.g., fixed, different relatively referenced phase readouts). Moreover, the coupling laser of the EIT or EIA-like system can be tuned to different Rydberg states to target different RF frequencies. Spectral signals within a bandwidth of, for example, about 250 MHz of a target frequency can be detected by analyzing the optical spectra.

In some implementations, the light in the control system—which may be necessary for monitoring the lasers and keeping them stable—can be routed via waveguide through all or part of the system. The light can be directed to the vapor cell sensor in free-space or through optical fiber. Feedback to control the lasers, including feed forwards, can be realized using FPGAs, analog electronics, or another processor-based system that can be controlled through a user interface and through autonomous control layers operating in different types of processors. In some variations, the system includes an agile laser system, an example of which is described in U.S. Pat. No. 11,658,461. The agile laser system can be advantageous in certain applications. For example, signals that depend on correlated reception can be encoded on several different carrier frequencies to avoid interception. Only by decoding the signal from each carrier frequency can the signal be decoded.

In some implementations, the signal processing system includes an optical detector (e.g., photodiode) to detect the optical signal from the vapor cell sensor. The optical detector is configured to sense changes in transmission through the vapor cell sensor due to the presence of RF waves. For example, a target RF wave may interact with an RF electronic transition of the vapor to alter a transmission or absorption of probe laser light, thereby producing the optical signal. The optical signal may then be converted to a digital signal-such as by operation of the photodetector and possibly also an analog-to-digital converter—that can be processed on a FPGA, GPU, or computer processor, or some combination thereof, including specialized hybrid processors.

Figure 5:
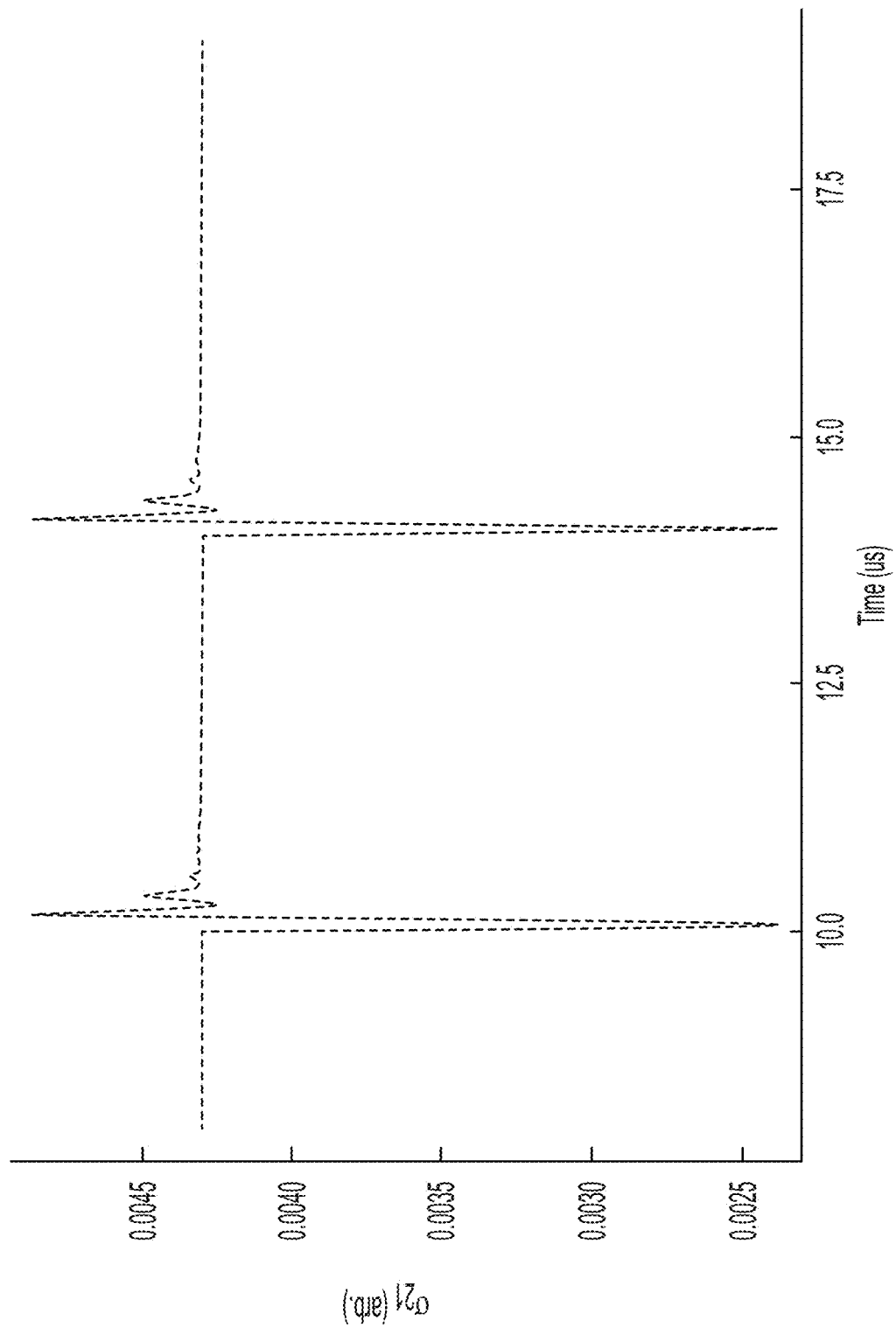
FIG. 5 is a graph showing an example of a time-dependent calculation for a transient response.

In some implementations, the system is configured to store the digital signal as a function of time while running it through multiple response templates. The response templates may allow the system to identify the periodicity, arrival time, and various other properties of incoming, time dependent RF signals. The response templates may also allow the system to pick out and/or separate the transient response and the steady-state response of the vapor in the vapor cell sensor. In some variations, the steady state response may occur at the backend of an RF pulse while the transient response is found at the leading edge of the RF pulse, such as shown in FIG. 5. FIG. 5 presents a graph showing an example of a time dependent calculation for a transient response. The pulse train in the graph has a temporal width of 4 μs. After 4 μs the phase is shifted by $\pi$. The time dependent calculation corresponds to a two-photon Rydberg atom-based sensor read-out. The probe Rabi frequency is 1 MHz, and the coupling laser Rabi frequency is 5 MHz. The RF Rabi frequency is 10 MHz. Changes in the transition dipole moment (which is proportional to $\sigma_{21}$) are comparable to the overall RF induced changes in the EIT readout signal.

In some implementations, the system is also capable of detecting repetitive RF waves. In these implementations, the waves (which may define a communication signal) can be averaged together over time or acquired in real-time. The wave train can then be subjected to Fourier transform analysis in the FPGA or processing unit. The resulting data can be used to locate and measure incoming waves that vary in time and space, calculate parameters such as peak power, decode transmission information, and calculate derivative information based on the measurements. Other characteristics of the RF waves are possible. The data may be available in whole or in part to the user via the user interface. Moreover, the digital signals can be stored in the system for future evaluation in whole or in part, including the calculated data.

Figure 6:
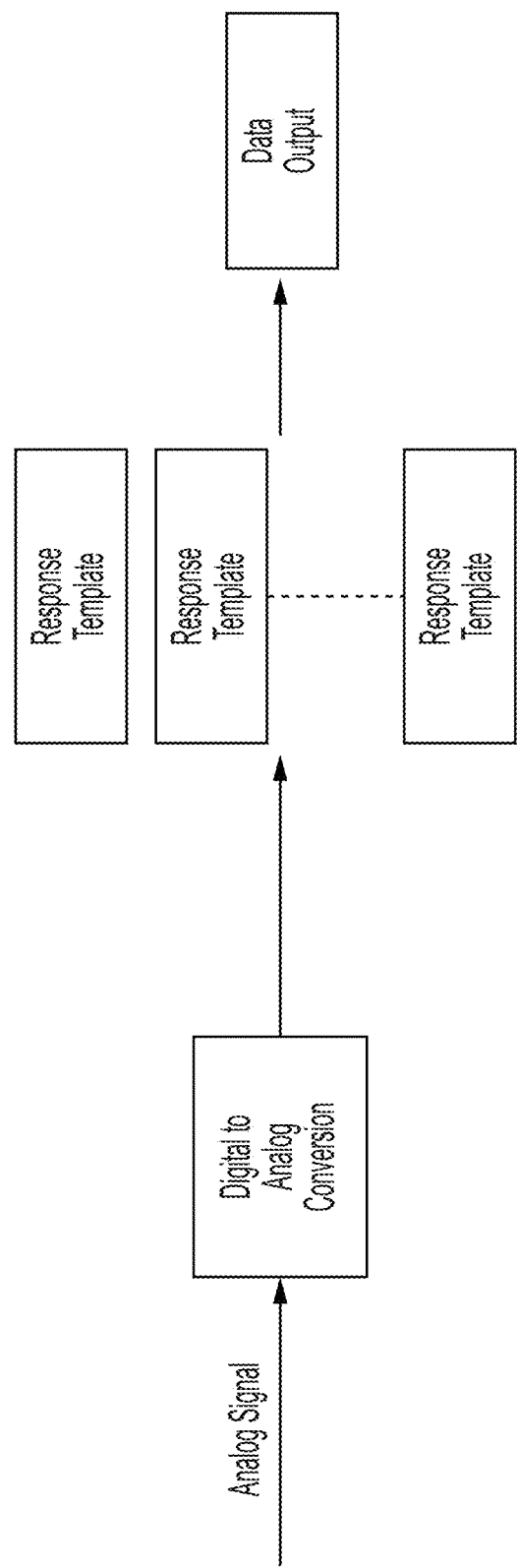
FIG. 6 is a flow chart showing an example process for processing a detector signal from an optical detection system through a plurality of response templates.

FIG. 6 presents a flow chart showing an example process for processing a detector signal from an optical detection system through a plurality of response templates. The example process may be used by a signal processing system, and the detector signal may be an analog signal. In the process, the analog, time-dependent detector signal from the optical detection system is first digitized. After digitization, the detector signal is replicated digitally and passed through a series of response templates in parallel. The response template output can determine the symbol. The highest correlated filter represents the incoming RF signal. The data is then output for further data processing or for display via the user interface. In many instances, the response templates are tailored to the response of the vapor (e.g., an atomic vapor) for optimum performance. However, in some instances, it may be possible to use simple filters like square pulse or transient pulse forms for the response templates.

In some implementations, the user interface includes a computer readable code that can be run on a processor and changed by the user to control the laser system and the signal processing system. The user interface may also run diagnostics to monitor the health of the system. The autonomous system interfaces with the user through the user interface, as does the signal processing system.

In some implementations, the vapor cell sensor is a metrology vapor cell, a conventional glass vapor cell, a conventional MEMs vapor cell, or another type of engineered vapor cell based on metamaterial or photonic crystal principles. Multiple vapor cell sensors are possible, including combinations of different types of vapor cells. The vapor cell can be encased in a thin electromagnetically transparent housing, such as one made from PLA plastic. The enclosure can accommodate a holder for the vapor cell and its waveguide. Several vapor cells addressed by different, detuned lasers are also possible. It is also possible that multiple sets of Rydberg vapor-based sensing beams can pass through a single vapor cell or multiple vapor cells.

In some implementations, the system is battery powered, plugged into wall power, or both. Battery operation may be required for remote field testing. However, some remote testing can allow for power supplied by a generator, such as a vehicle engine running an alternator to charge a battery and supply DC power. For some applications, such as over-the-air (OTA) field testing and radar, the system can include one or both of a GPS receiver for positioning and a precision clock for timing and data fusion.

Figure 7:
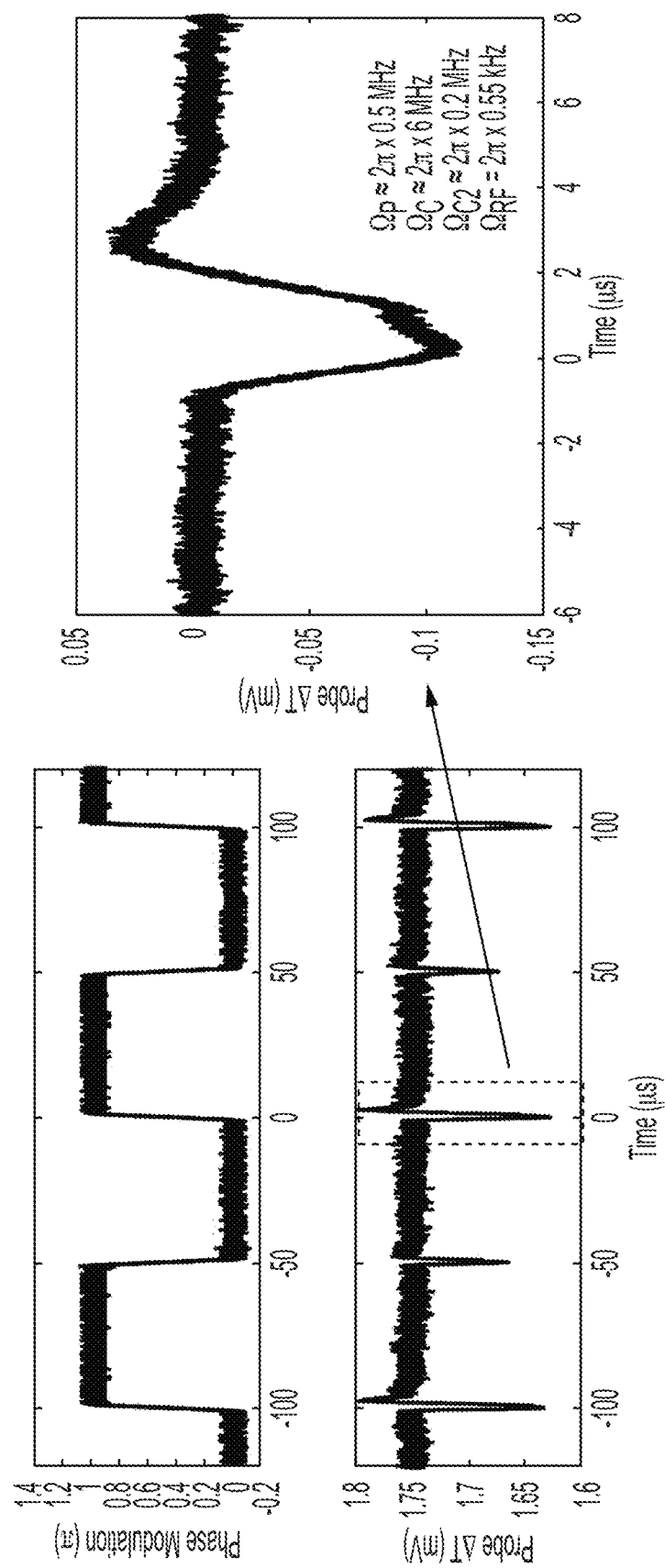
FIG. 7 is a series of graphs that show an experimental time series of RF pulses.

FIG. 7 presents a series of graphs that show an experimental time series of RF pulses. Each RF pulse may correspond to a phase pulse of about 4 μs in temporal length. The system used to acquire the data is configured for a three-level, Doppler-free Rydberg atom-based readout scheme (e.g., as shown in FIG. 3D). The system may be analogous to the example system 200 of FIG. 2 or the example system of FIG. 3A. As shown in FIG. 7, each RF pulse is clearly detected. FIG. 7 shows the experimental trace of a phase modulated pulse sequence, with the inset of the right graph showing the laser parameters used to make the measurements.

The system may be used to implement a method for detecting a phase of a radio-frequency wave. The method may be used in various applications, two examples of which are discussed below. To implement the method, the system may use different configurations of the same components. For example, three Rydberg vapor-cell sensors or three independent beam sets passing through a single vapor cell sensor can be used. Three sensors with different respective detunings may allow for better precision for detecting the phase.

In some implementations, the method may be configured for simple binary phase modulation. As such, the method may be used for BPSK detection or detection in some forms of radar detection. The system for implementing the method may be configured as described in relation to FIG. 2 or FIGS. 3A-3D. In some implementations, only a single vapor cell sensor is required. However, multiple vapor cells are possible. In some implementations, multiple beam paths may pass through the single vapor cell sensor. In these implementations, each beam path may be used to propagate a set of two or more laser signals.

The method may include acquiring a target RF time-dependent pulse train (e.g., a time series of RF pulses). The pulse train may be modulated in one on or both of phase and amplitude. The method may also include feeding an analog signal from an optical detector—such as that generated by the optical detector in response to receiving a probe laser signal from a vapor cell sensor-into an analog-to-digital (A/D) converter. The A/D converter is in communication with a digital processing system and feeds a digital signal to the digital processing system. The digital signal may be based on detector signal from the optical detector after conversion by the A/D converter. The method additionally includes replicating the digital signal in the digital processing system and running it through a series of response templates. Each response template may correspond to a symbol of the system (e.g., communications or radar) that is tailored to the vapor response (e.g., atomic response) of the corresponding RF pulse response.

The method also includes analyzing the response template output. The largest response may correspond to the symbol that was transmitted. It may also be possible to analyze the correlation data to determine the probability of an error. The bit-error rate can be determined from the overall data acquired. The method also includes processing the symbols as appropriate to the application and sending the symbol/ data to the user interface. This process may be repeated for each symbol in the pulse train.

In some implementations, the method may be configured for IQ analog phase detection. As such, the method may be used for IQ detection in radar and communications applications. The system for implementing the method may be configured as described in relation to FIG. 2 and FIGS. 3A-3D. In some instances, the system includes at least two different vapor cell sensors, two beam paths passing through a single vapor cell sensor, or some combination thereof. More than two sensor readouts are also possible, e.g., three beam paths passing through in a single vapor cell sensor. The set of laser signals propagating along each beam path may be detuned from each other by a small amount, approximately less than the spectral linewidth of the EIT/EIA-like feature being used for sensing. In some variations, a co-linear three-photon readout and preparation method may be used that is Doppler free. By being Doppler free, the method may maximally preserve phase sensitivity and thus allow the system to provide better performance.

To implement the method, the system may be set up as shown in FIG. 2 or FIG. 3A. As such, the system may include the vapor cell sensor and its mount, the laser system, the optical detection system, the signal processing system, and the user interface. However, instead of one optical communication link, two optical communication links are coupled to the vapor cell sensor, with each link including one fiber source and one fiber receiver. A first set of lasers, detuned by a variable amount, is configured to pass through a first set of fiber sources and receivers (e.g., that are part of the first optical communication link). A second set of lasers, tuned to resonance, is configured to pass through a second set of fiber sources and receivers (e.g., that are part of the second optical communication link). The detuning of the first set of lasers is set to induce a $\pi/2$ phase shift of the system relative to the resonance channel. The two channels are each part of a subsystem of the overall system.

The method includes acquiring a target RF time-dependent pulse train (e.g., a time series of RF pulses). The pulse train may be modulated in one on or both of phase and amplitude. Moreover, each subsystem acquires the signal. The method also includes feeding the detector signal from each optical sub-system into an analog-to-digital (A/D) converter. Each optical sub-system may include its own optical detector that is part of a respective probe laser detection sub-system. The A/D converter is communication with a digital processing system and feeds digital signals thereto. The digital signals may be based on detector signals from respective optical sub-systems after conversion by the A/D converter.

The method additionally includes replicating each digital signal in the digital processing system and running it through a series of response templates. Each response template corresponds to a symbol of the system (e.g., communications or radar) that is tailored to the vapor response (e.g., atomic response) of the corresponding RF pulse response.

The method also includes analyzing the response template output. The largest response may correspond to the symbol that was transmitted. It may also be possible to analyze the correlation data to determine the probability of an error. The bit-error rate can be determined from the overall data acquired. Using both symbols, it is possible to determine the overall phase of the incoming RF wave over a $2\pi$ range, since the asymmetry of the detuning enables the detection of the equivalent of the IQ values (e.g., the in-phase and in-quadrature amplitudes).

The method also includes processing the symbols and IQ data as appropriate to the application and sending the symbol and IQ data to the user interface. This process may be repeated for each symbol in the pulse train as required.

In some aspects of what is described, a system may be described by the following examples. The system may be configured to detect the phase properties of an RF wave (e.g., a phase of the RF wave, a phase change of the RF wave, etc.). Such detection may, in certain cases, also include detecting the amplitude properties of the RF wave (e.g., an amplitude of the RF wave, an amplitude change of the RF wave, etc.). In some implementations, the RF wave may define a communication signal. In these implementations, the system may be further configured to use the detected properties to decode the RF wave, such as by assigning symbols of a communication protocol to the RF wave.

Example 1. A system, comprising:
    a vapor cell sensor containing a vapor and configured to generate an optical signal in response to laser signals that interact with the vapor, wherein:
        the vapor has a Rydberg electronic transition that interacts with a target RF electromagnetic field, the target RF electromagnetic field comprising a time series of RF pulses, and
        the optical signal is based on a transmission of one of the laser signals through the vapor;

an optical detection system configured to generate a detector signal in response to receiving the optical signal; and a signal processing system configured to receive the detector signal and perform operations that comprise:

generating, based on the detector signal, response data that represents a response of the vapor to the laser signals and the target RF electromagnetic field, determining, based on the response data, an interval during which the vapor experiences a transient response to the target RF electromagnetic field, the interval associated with a phase change in the time series of RF pulses, and determining a magnitude of the phase change based on a portion of the response data that is generated during the interval.

Example 2. The system of example 1, wherein the operations of the signal processing system comprise:

identifying, based on the interval, a transition between two consecutive RF pulses in the time series of RF pulses, the two consecutive RF pulses comprising a target RF pulse and a previous RF pulse;

determining a phase of the target RF pulse based on the magnitude of the phase change and a phase of the previous RF pulse; and assigning a symbol to the target RF pulse based on the determined phase, the symbol being part of a plurality of symbols of a communication protocol.

Example 3. The system of example 2, wherein the time series of RF pulses comprise one or more initializing RF pulses that establish a reference phase for the time series of RF pulses;

wherein the one or more initializing RF pulses comprise the previous RF pulse; and wherein the reference phase defines the phase of the previous RF pulse.

Example 4. The system of example 1, wherein the time series of RF pulses share a pulse period in common; and wherein determining the interval comprises:

generating a sampled portion of response data by sampling the response data over a sampling period that is based on the pulse period, comparing the sampled portion of response data to each of a plurality of response templates to determine respective degrees of fit, each response template having template data that represents a known response of the vapor to a different reference RF pulse, selecting one of the response templates based on its degree of fit, and determining the interval based on the sampled portion of response data and the template data of the selected response template.

Example 5. The system of example 4, wherein determining the magnitude of the phase change comprises determining the magnitude of the phase change based on:

the portion of the response data that is generated during the interval; and the template data of the selected response template.

Example 6. The system of example 4 or example 5, wherein the plurality of response templates are associated with respective symbols of a communication protocol; and wherein the operations of the signal processing system comprise:

identifying, based on the interval, a transition between two consecutive RF pulses in the time series of RF pulses, the two consecutive RF pulses comprising a target RF pulse and a previous RF pulse, and assigning the symbol of the selected response template to the target RF pulse.

Example 7. The system of example 4 any one of examples 5-6, wherein comparing the sampled portion of response data comprises generating, for each response template, a difference between the template data of the response template and the sampled portion of response data, the difference defining the degree of fit for the response template; and wherein selecting one of the response templates comprises identifying an individual response template that has a minimum difference between its template data and the sampled portion of response data, the individual response template defining the selected response template.

Example 8. The system of example 1, wherein the time series of RF pulses share a pulse period in common;

wherein the interval is an extended interval during which the vapor experiences two or more transient responses to the target RF electromagnetic field, the extended interval comprising two or more sub-intervals that are associated with respective phase changes in the time series of RF pulses; and wherein determining the interval comprises:

generating a sampled portion of response data by sampling the response data over a sampling period that is based on a multiple number of pulse periods, comparing the sampled portion of response data to each of a plurality of response templates to determine respective degrees of fit, each response template having template data that represents a known response of the vapor to a different sequence of reference RF pulses, selecting one of the response templates based on its degree of fit, and determining the extended interval based on the sampled portion of response data and the template data of the selected response template.

Example 9. The system of example 8, wherein determining the magnitude of the phase change comprises determining a magnitude of each phase change associated with the two or more sub-intervals based on:

an extended portion of the response data that is generated during the extended interval; and the template data of the selected response template.

Example 10. The system of example 8 or example 9, wherein the plurality of response templates are associated with respective sequences of symbols that are part of a communication protocol;

wherein the time series of RF pulses comprises a sequence of RF pulses in the extended interval; and wherein the operations of the signal processing system comprise assigning the sequence of symbols of the selected response template to the sequence of RF pulses.

Example 11. The system of example 1,
  wherein the interval is a first interval, and the portion of the response data is a first portion of the response data; and
  wherein the operations of the signal processing system comprise:
    determining, based on the response data, a second interval during which the vapor experiences a steady-state response to the target RF electromagnetic field, and
    determining an amplitude of a target RF pulse in the time series of RF pulses based on a second portion of the response data that is generated during the second interval.

Example 12. The system of example 11,
  wherein the phase change in the time series of RF pulses occurs between two consecutive RF pulses in the time series of RF pulses, the two consecutive RF pulses comprising the target RF pulse and a previous RF pulse; and
  wherein operations of the signal processing system comprise:
    determining a phase of the target RF pulse based on the magnitude of the phase change and a phase of the previous RF pulse, and
    assigning a symbol to the target RF pulse based on the determined phase and the determined amplitude, the symbol being part of a plurality of symbols of a communication protocol.

Example 13. The system of example 11,
  wherein the time series of RF pulses share a pulse period in common; and
  wherein determining the second interval comprises:
    generating a sampled portion of response data by sampling the response data over a sampling period that is based on the pulse period,
    comparing the sampled portion of response data to each of a plurality of response templates to determine respective degrees of fit, each response template having template data that represents a known response of the vapor to a different reference RF pulse,
    selecting one of the response templates based on its degree of fit, and
    determining the second interval based on the sampled portion of response data and the template data of the selected response template.

Example 14. The system of example 13, wherein determining the amplitude of the target RF pulse comprises determining the amplitude of the target RF pulse based on:
  the second portion of the response data that is generated during the second interval; and
  the template data of the selected response template.

Example 15. The system of example 1,
  wherein the time series of RF pulses share a pulse period in common;
  wherein the interval is an extended interval during which the vapor experiences one or more transient responses and one or more steady-state responses to the target RF electromagnetic field, the extended interval comprising:
    one or more first sub-intervals that are associated with respective phase changes in a target sequence of RF pulses, and
    one or more second sub-intervals that are associated with respective amplitudes of the target sequence of RF pulses; and
  wherein determining the interval comprises:
    generating a sampled portion of response data by sampling the response data over a sampling period that is based on a multiple number of pulse periods,
    comparing the sampled portion of response data to each of a plurality of response templates to determine respective degrees of fit, each response template having template data that represents a known response of the vapor to a different sequence of reference RF pulses,
    selecting one of the response templates based on its degree of fit, and
    determining the extended interval based on the sampled portion of response data and the template data of the selected response template.

Example 16. The system of example 15,
  wherein determining the magnitude of the phase change comprises determining a magnitude of each phase change associated with the one or more first sub-intervals based on:
    an extended portion of the response data that is generated during the extended interval, and
    the template data of the selected response template; and
  wherein the operations of the signal processing system comprise determining each amplitude associated with the one or more second sub-intervals based on:
    the extended portion of the response data, and
    the template data of the selected response template.

Example 17. The system of example 15 or example 16,
  wherein the plurality of response templates are associated with respective sequences of symbols that are part of a communication protocol; and
  wherein the operations of the signal processing system comprise assigning the sequence of symbols of the selected response template to the target sequence of RF pulses.

Example 18. The system of example 1 or any one of examples 2-17, wherein generating the response data comprises generating values for respective elements of a density matrix that represents a response of the vapor to the laser signals and the target RF electromagnetic field.

Example 19. The system of example 18, wherein determining the interval comprises determining a start and an end of the interval based on a magnitude of an element of the density matrix.

Example 20. The system of example 18 or example 19,
  wherein determining the interval comprises determining a decay rate of an element of the density matrix, the decay rate representing a transition of the vapor from the transient response to the target RF electromagnetic field to a steady-state response to the target RF electromagnetic field.

Example 21. The system of example 1 or any one of examples 2-20, comprising:
  a laser system configured to generate the laser signals;
  wherein the operations of the signal processing system comprise transmitting a control signal to the laser system to alter a frequency of one of the laser signals, thereby producing a detuned laser signal whose frequency is detuned relative to an optical electronic transition of the vapor;

wherein the optical signal is based on a transmission of the detuned laser signal through the vapor, and the response data comprises detuned response data that represents the response of the vapor when the laser signals comprise the detuned laser signal; and wherein determining the magnitude of the phase change comprises determining a sign of the phase change based on the detuned response data.

Example 22. The system of example 21,
wherein the detuned laser signal is a first detuned laser signal, and the control signal is a first control signal;
wherein the operations of the signal processing system comprise transmitting a second control signal to the laser system to produce a second detuned laser signal, the second detuned laser signal detuned relative to the optical electronic transition of the vapor (e.g., simultaneously with the first detuned laser signal); and
wherein the detuned response data represents the response of the vapor when the laser signals comprise the first and second detuned laser signals.

Example 23. The system of example 22, wherein the first and second detuned laser signals have respective frequencies that are symmetrically detuned about the optical electronic transition of the vapor.

Example 24. The system of example 22, wherein the first and second detuned laser signals have respective frequencies that are asymmetrically detuned about the optical electronic transition of the vapor.

Example 25. The system of example 1 or any one of examples 2-24,
wherein the laser signals comprise probe and coupling laser signals; and
wherein:
the optical signal is based on a transmission of the probe laser signal through the vapor,
the probe laser signal is configured to interact with a probe optical transition of the vapor, and
the coupling laser signal is configured to interact with a coupling optical transition of the vapor.

Example 26. The system of example 25,
wherein the vapor has electronic states that comprise:
first and second electronic states, and
first and second Rydberg electronic states;
wherein the first electronic state, the second electronic state, and the first Rydberg electronic state are progressively higher in energy; and
wherein:
the probe optical transition is defined by the first and second electronic states,
the coupling optical transition is defined by the second electronic state and the first Rydberg electronic state, and
the Rydberg electronic transition is defined by the first and second Rydberg electronic states.

Example 27. The system of example 25,
wherein the coupling laser signal is a first coupling laser signal, and the coupling optical transition is a first coupling optical transition; and
wherein the laser signals comprise a second coupling laser signal that is configured to interact with a second coupling optical transition of the vapor.

Example 28. The system of example 27,
wherein the vapor has electronic states that comprise:
first, second, and third electronic states, and
first and second Rydberg electronic states;
wherein the first electronic state, the second electronic state, the third electronic state, and the first Rydberg electronic state are progressively higher in energy; and
wherein:
the probe optical transition is defined by the first and second electronic states,
the first coupling optical transition is defined by the second electronic state and the third electronic state,
the second coupling optical transition is defined by the third electronic state and the first Rydberg electronic state, and
the Rydberg electronic transition is defined by the first and second Rydberg electronic states.

Example 29. The system of example 1 or any one of examples 2-28,
wherein the laser signals comprise a probe laser signal having comb lines at respective comb frequencies, the comb lines representing different respective detunings of the probe laser signal relative to a probe optical transition of the vapor;
wherein the optical signal is based on a transmission of the probe laser signal through the vapor;
wherein the detector signal represents an intensity of the optical signal at two or more comb frequencies that are associated with respective target comb lines of the probe laser signal; and
wherein generating response data comprises generating a subset of response data for each target comb line of the probe laser signal.

Example 30. The system of example 29,
wherein the respective target comb lines of the probe laser signal comprise first and second target comb lines;
wherein determining the interval comprises:
determining a first interval for the first target comb line based on a first subset of response data that is generated for the first target comb line, the first interval associated with a first phase change in the time series of RF pulses, and
determining a second interval for the second target comb line based on a second subset of response data that is generated for the second target comb line, the second interval associated with a second phase change in the time series of RF pulses; and
wherein determining the magnitude of the phase change comprises:
determining a magnitude of the first phase change based on a portion of the first subset of response data that is generated during the first interval, and
determining a magnitude of the second phase change based on a portion of the second subset of response data that is generated during the second interval.

Example 31. The system of example 1 or any one of examples 2-30,
wherein the laser signals comprise a probe laser signal and a coupling laser signal, the coupling laser signal having comb lines at respective comb frequencies, the comb lines representing different respective detunings of the coupling laser signal relative to a coupling optical transition of the vapor;

wherein the optical signal comprises optical sub-signals that are associated with respective comb lines of the coupling laser signal, the optical sub-signals based on a transmission of the probe laser signal through the vapor as the respective comb lines of the coupling laser signal interact with the vapor;

wherein two or more of the optical sub-signals are associated with respective target comb lines of the coupling laser signal, the two or more optical sub-signals each having an intensity;

wherein the detector signal represents the intensities of the two or more optical sub-signals; and wherein generating response data comprises generating a subset of response data for each target comb line of the coupling laser signal.

Example 32. The system of example 31, wherein the time series of RF pulses is a first time series of RF pulses, and the target RF electromagnetic field comprises a second time series of RF pulses, the first and second time series of RF pulses having different carrier frequencies;

wherein the respective target comb lines of the coupling laser signal comprise first and second target comb lines that are associated with, respectively, the first and second time series of RF pulses;

wherein determining the interval comprises:
  determining a first interval for the first target comb line based on a first subset of response data that is generated for the first target comb line, the first interval associated with a first phase change in the first time series of RF pulses, and
  determining a second interval for the second target comb line based on a second subset of response data that is generated for the second target comb line, the second interval associated with a second phase change in the second time series of RF pulses; and wherein determining the magnitude of the phase change comprises:
  determining a magnitude of the first phase change based on a portion of the first subset of response data that is generated during the first interval, and
  determining a magnitude of the second phase change based on a portion of the second subset of response data that is generated during the second interval.

In some aspects of what is described, a method may be described by the following examples. The method may be used to detect the phase properties of an RF wave (e.g., a phase of the RF wave, a phase change of the RF wave, etc.). Such detection may, in certain cases, also include detecting the amplitude properties of the RF wave (e.g., an amplitude of the RF wave, an amplitude change of the RF wave, etc.). In some implementations, the RF wave defines a communication signal. In these implementations, the method may use the detected properties to decode the RF wave, such as by assigning symbols of a communication protocol to the RF wave.

Example 33. A method, comprising:
  generating an optical signal by interacting laser signals with a vapor of a vapor cell sensor, the optical signal based on a transmission of one of the laser signals through the vapor;
  altering an intensity of the optical signal by interacting a target RF electromagnetic field with a Rydberg electronic transition of the vapor, the target RF electromagnetic field comprising a time series of RF pulses;
  generating, by operation of an optical detection system, a detector signal in response to receiving the optical signal at the optical detection system; and
  by operation of a signal processing system:
    generating, based on the detector signal, response data that represents a response of the vapor to the laser signals and the target RF electromagnetic field,
    determining, based on the response data, an interval during which the vapor experiences a transient response to the target RF electromagnetic field, the interval associated with a phase change in the time series of RF pulses, and
    determining a magnitude of the phase change based on a portion of the response data that is generated during the interval.

Example 34. The method of example 33, wherein the operations of the signal processing system comprise:
  identifying, based on the interval, a transition between two consecutive RF pulses in the time series of RF pulses, the two consecutive RF pulses comprising a target RF pulse and a previous RF pulse;
  determining a phase of the target RF pulse based on the magnitude of the phase change and a phase of the previous RF pulse; and
  assigning a symbol to the target RF pulse based on the determined phase, the symbol being part of a plurality of symbols of a communication protocol.

Example 35. The method of example 34,
  wherein the time series of RF pulses comprise one or more initializing RF pulses that establish a reference phase for the time series of RF pulses;
  wherein the one or more initializing RF pulses comprise the previous RF pulse; and
  wherein the reference phase defines the phase of the previous RF pulse.

Example 36. The method of example 33,
  wherein the time series of RF pulses share a pulse period in common; and
  wherein determining the interval comprises:
    generating a sampled portion of response data by sampling the response data over a sampling period that is based on the pulse period,
    comparing the sampled portion of response data to each of a plurality of response templates to determine respective degrees of fit, each response template having template data that represents a known response of the vapor to a different reference RF pulse,
    selecting one of the response templates based on its degree of fit, and
    determining the interval based on the sampled portion of response data and the template data of the selected response template.

Example 37. The method of example 36, wherein determining the magnitude of the phase change comprises determining the magnitude of the phase change based on:
  the portion of the response data that is generated during the interval; and
  the template data of the selected response template.

Example 38. The method of example 36 or example 37,
wherein the plurality of response templates are associated with respective symbols of a communication protocol; and
wherein the operations of the signal processing system comprise:
identifying, based on the interval, a transition between two consecutive RF pulses in the time series of RF pulses, the two consecutive RF pulses comprising a target RF pulse and a previous RF pulse, and
assigning the symbol of the selected response template to the target RF pulse.

Example 39. The method of example 36 or any one of examples 37-38,
wherein comparing the sampled portion of response data comprises generating, for each response template, a difference between the template data of the response template and the sampled portion of response data, the difference defining the degree of fit for the response template; and
wherein selecting one of the response templates comprises identifying an individual response template that has a minimum difference between its template data and the sampled portion of response data, the individual response template defining the selected response template.

Example 40. The method of example 33,
wherein the time series of RF pulses share a pulse period in common;
wherein the interval is an extended interval during which the vapor experiences two or more transient responses to the target RF electromagnetic field, the extended interval comprising two or more sub-intervals that are associated with respective phase changes in the time series of RF pulses; and
wherein determining the interval comprises:
generating a sampled portion of response data by sampling the response data over a sampling period that is based on a multiple number of pulse periods, comparing the sampled portion of response data to each of a plurality of response templates to determine respective degrees of fit, each response template having template data that represents a known response of the vapor to a different sequence of reference RF pulses,
selecting one of the response templates based on its degree of fit, and
determining the extended interval based on the sampled portion of response data and the template data of the selected response template.

Example 41. The method of example 40, wherein determining the magnitude of the phase change comprises determining a magnitude of each phase change associated with the two or more sub-intervals based on:
an extended portion of the response data that is generated during the extended interval; and
the template data of the selected response template.

Example 42. The method of example 40 or example 41,
wherein the plurality of response templates are associated with respective sequences of symbols that are part of a communication protocol;
wherein the time series of RF pulses comprises a sequence of RF pulses in the extended interval; and
wherein the operations of the signal processing system comprise assigning the sequence of symbols of the selected response template to the sequence of RF pulses.

Example 43. The method of example 33,
wherein the interval is a first interval, and the portion of the response data is a first portion of the response data; and
wherein the operations of the signal processing system comprise:
determining, based on the response data, a second interval during which the vapor experiences a steady-state response to the target RF electromagnetic field, and
determining an amplitude of a target RF pulse in the time series of RF pulses based on a second portion of the response data that is generated during the second interval.

Example 44. The method of example 43,
wherein the phase change in the time series of RF pulses occurs between two consecutive RF pulses in the time series of RF pulses, the two consecutive RF pulses comprising the target RF pulse and a previous RF pulse; and
wherein operations of the signal processing system comprise:
determining a phase of the target RF pulse based on the magnitude of the phase change and a phase of the previous RF pulse, and
assigning a symbol to the target RF pulse based on the determined phase and the determined amplitude, the symbol being part of a plurality of symbols of a communication protocol.

Example 45. The method of example 43,
wherein the time series of RF pulses share a pulse period in common; and
wherein determining the second interval comprises:
generating a sampled portion of response data by sampling the response data over a sampling period that is based on the pulse period,
comparing the sampled portion of response data to each of a plurality of response templates to determine respective degrees of fit, each response template having template data that represents a known response of the vapor to a different reference RF pulse,
selecting one of the response templates based on its degree of fit, and
determining the second interval based on the sampled portion of response data and the template data of the selected response template.

Example 46. The method of example 45, wherein determining the amplitude of the target RF pulse comprises determining the amplitude of the target RF pulse based on:
the second portion of the response data that is generated during the second interval; and
the template data of the selected response template.

Example 47. The method of example 33,
wherein the time series of RF pulses share a pulse period in common;
wherein the interval is an extended interval during which the vapor experiences one or more transient responses and one or more steady-state responses to the target RF electromagnetic field, the extended interval comprising:

one or more first sub-intervals that are associated with respective phase changes in a target sequence of RF pulses, and
one or more second sub-intervals that are associated with respective amplitudes of the target sequence of RF pulses; and
wherein determining the interval comprises:
generating a sampled portion of response data by sampling the response data over a sampling period that is based on a multiple number of pulse periods,
comparing the sampled portion of response data to each of a plurality of response templates to determine respective degrees of fit, each response template having template data that represents a known response of the vapor to a different sequence of reference RF pulses,
selecting one of the response templates based on its degree of fit, and
determining the extended interval based on the sampled portion of response data and the template data of the selected response template.

Example 48. The method of example 47,
wherein determining the magnitude of the phase change comprises determining a magnitude of each phase change associated with the one or more first sub-intervals based on:
an extended portion of the response data that is generated during the extended interval, and
the template data of the selected response template; and
wherein the operations of the signal processing system comprise determining each amplitude associated with the one or more second sub-intervals based on:
the extended portion of the response data, and
the template data of the selected response template.

Example 49. The method of example 47 or example 48,
wherein the plurality of response templates are associated with respective sequences of symbols that are part of a communication protocol; and
wherein the operations of the signal processing system comprise assigning the sequence of symbols of the selected response template to the target sequence of RF pulses.

Example 50. The method of example 33 or any one of examples 34-49, wherein generating the response data comprises generating values for respective elements of a density matrix that represents a response of the vapor to the laser signals and the target RF electromagnetic field.

Example 51. The method of example 50, wherein determining the interval comprises determining a start and an end of the interval based on a magnitude of an element of the density matrix.

Example 52. The method of example 50 or example 51, wherein determining the interval comprises determining a decay rate of an element of the density matrix, the decay rate representing a transition of the vapor from the transient response to the target RF electromagnetic field to a steady-state response to the target RF electromagnetic field.

Example 53. The method of example 33 or any one of examples 34-52, comprising: generating the laser signals by operation of a laser system;
wherein the operations of the signal processing system comprise transmitting a control signal to the laser system to alter a frequency of one of the laser signals, thereby producing a detuned laser signal whose frequency is detuned relative to an optical electronic transition of the vapor;
wherein the optical signal is based on a transmission of the detuned laser signal through the vapor, and the response data comprises detuned response data that represents the response of the vapor when the laser signals comprise the detuned laser signal; and
wherein determining the magnitude of the phase change comprises determining a sign of the phase change based on the detuned response data.

Example 54. The method of example 53,
wherein the detuned laser signal is a first detuned laser signal, and the control signal is a first control signal;
wherein the operations of the signal processing system comprise transmitting a second control signal to the laser system to produce a second detuned laser signal, the second detuned laser signal detuned relative to the optical electronic transition of the vapor (e.g., simultaneously with the first detuned laser signal); and
wherein the detuned response data represents the response of the vapor when the laser signals comprise the first and second detuned laser signals.

Example 55. The method of example 54, wherein the first and second detuned laser signals have respective frequencies that are symmetrically detuned about the optical electronic transition of the vapor.

Example 56. The method of example 54, wherein the first and second detuned laser signals have respective frequencies that are asymmetrically detuned about the optical electronic transition of the vapor.

Example 57. The method of example 33 or any one of examples 34-56,
wherein the laser signals comprise probe and coupling laser signals; and
wherein:
the optical signal is based on a transmission of the probe laser signal through the vapor,
the probe laser signal interacts with a probe optical transition of the vapor, and
the coupling laser signal interacts with a coupling optical transition of the vapor.

Example 58. The method of example 57,
wherein the vapor has electronic states that comprise:
first and second electronic states, and
first and second Rydberg electronic states;
wherein the first electronic state, the second electronic state, and the first Rydberg electronic state are progressively higher in energy; and
wherein:
the probe optical transition is defined by the first and second electronic states,
the coupling optical transition is defined by the second electronic state and the first Rydberg electronic state, and
the Rydberg electronic transition is defined by the first and second Rydberg electronic states.

Example 59. The method of example 57,
wherein the coupling laser signal is a first coupling laser signal, and the coupling optical transition is a first coupling optical transition; and
wherein the laser signals comprise a second coupling laser signal that interacts with a second coupling optical transition of the vapor.

Example 60. The method of example 59,
  wherein the vapor has electronic states that comprise:
    first, second, and third electronic states, and
    first and second Rydberg electronic states;
  wherein the first electronic state, the second electronic state, the third electronic state, and the first Rydberg electronic state are progressively higher in energy; and
  wherein:
    the probe optical transition is defined by the first and second electronic states,
    the first coupling optical transition is defined by the second electronic state and the third electronic state,
    the second coupling optical transition is defined by the third electronic state and the first Rydberg electronic state, and
    the Rydberg electronic transition is defined by the first and second Rydberg electronic states.
Example 61. The method of example 33 or any one of examples 34-60,
  wherein the laser signals comprise a probe laser signal having comb lines at respective comb frequencies, the comb lines representing different respective detunings of the probe laser signal relative to a probe optical transition of the vapor;
  wherein the optical signal is based on a transmission of the probe laser signal through the vapor;
  wherein the detector signal represents an intensity of the optical signal at two or more comb frequencies that are associated with respective target comb lines of the probe laser signal; and
  wherein generating response data comprises generating a subset of response data for each target comb line of the probe laser signal.
Example 62. The method of example 61,
  wherein the respective target comb lines of the probe laser signal comprise first and second target comb lines;
  wherein determining the interval comprises:
    determining a first interval for the first target comb line based on a first subset of response data that is generated for the first target comb line, the first interval associated with a first phase change in the time series of RF pulses, and
    determining a second interval for the second target comb line based on a second subset of response data that is generated for the second target comb line, the second interval associated with a second phase change in the time series of RF pulses; and
  wherein determining the magnitude of the phase change comprises:
    determining a magnitude of the first phase change based on a portion of the first subset of response data that is generated during the first interval, and
    determining a magnitude of the second phase change based on a portion of the second subset of response data that is generated during the second interval.
Example 63. The method of example 33 or any one of examples 34-62,
  wherein the laser signals comprise a probe laser signal and a coupling laser signal, the coupling laser signal having comb lines at respective comb frequencies, the comb lines representing different respective detunings of the coupling laser signal relative to a coupling optical transition of the vapor;
  wherein the optical signal comprises optical sub-signals that are associated with respective comb lines of the coupling laser signal, the optical sub-signals based on a transmission of the probe laser signal through the vapor as the respective comb lines of the coupling laser signal interact with the vapor;
  wherein two or more of the optical sub-signals are associated with respective target comb lines of the coupling laser signal, the two or more optical sub-signals each having an intensity;
  wherein the detector signal represents the intensities of the two or more optical sub-signals; and
  wherein generating response data comprises generating a subset of response data for each target comb line of the coupling laser signal.
Example 64. The method of example 63,
  wherein the time series of RF pulses is a first time series of RF pulses, and the target RF electromagnetic field comprises a second time series of RF pulses, the first and second time series of RF pulses having different carrier frequencies;
  wherein the respective target comb lines of the coupling laser signal comprise first and second target comb lines that are associated with, respectively, the first and second time series of RF pulses;
  wherein determining the interval comprises:
    determining a first interval for the first target comb line based on a first subset of response data that is generated for the first target comb line, the first interval associated with a first phase change in the first time series of RF pulses, and
    determining a second interval for the second target comb line based on a second subset of response data that is generated for the second target comb line, the second interval associated with a second phase change in the second time series of RF pulses; and
  wherein determining the magnitude of the phase change comprises:
    determining a magnitude of the first phase change based on a portion of the first subset of response data that is generated during the first interval, and
    determining a magnitude of the second phase change based on a portion of the second subset of response data that is generated during the second interval.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A system, comprising:
   a vapor cell sensor containing a vapor and configured to generate an optical signal in response to laser signals that interact with the vapor, wherein:
   the vapor has a Rydberg electronic transition that interacts with a target RF electromagnetic field, the target RF electromagnetic field comprising a time series of RF pulses, and
   the optical signal is based on a transmission of one of the laser signals through the vapor;
   an optical detection system configured to generate a detector signal in response to receiving the optical signal; and
   a signal processing system configured to receive the detector signal and perform operations that comprise:
   generating, based on the detector signal, response data that represents a response of the vapor to the laser signals and the target RF electromagnetic field,
   determining, based on the response data, an interval during which the vapor experiences a transient response to the target RF electromagnetic field, the interval associated with a phase change in the time series of RF pulses, and
   determining a magnitude of the phase change based on a portion of the response data that is generated during the interval.

2. The system of claim 1, wherein the operations of the signal processing system comprise:
   identifying, based on the interval, a transition between two consecutive RF pulses in the time series of RF pulses, the two consecutive RF pulses comprising a target RF pulse and a previous RF pulse;
   determining a phase of the target RF pulse based on the magnitude of the phase change and a phase of the previous RF pulse; and
   assigning a symbol to the target RF pulse based on the determined phase, the symbol being part of a plurality of symbols of a communication protocol.

3. The system of claim 2,
   wherein the time series of RF pulses comprise one or more initializing RF pulses that establish a reference phase for the time series of RF pulses;
   wherein the one or more initializing RF pulses comprise the previous RF pulse; and
   wherein the reference phase defines the phase of the previous RF pulse.

4. The system of claim 1,
   wherein the time series of RF pulses share a pulse period in common; and
   wherein determining the interval comprises:
   generating a sampled portion of response data by sampling the response data over a sampling period that is based on the pulse period,
   comparing the sampled portion of response data to each of a plurality of response templates to determine respective degrees of fit, each response template having template data that represents a known response of the vapor to a different reference RF pulse,
   selecting one of the response templates based on its degree of fit, and
   determining the interval based on the sampled portion of response data and the template data of the selected response template.

5. The system of claim 4, wherein determining the magnitude of the phase change comprises determining the magnitude of the phase change based on:
   the portion of the response data that is generated during the interval; and
   the template data of the selected response template.

6. The system of claim 4,
   wherein the plurality of response templates are associated with respective symbols of a communication protocol; and
   wherein the operations of the signal processing system comprise:
   identifying, based on the interval, a transition between two consecutive RF pulses in the time series of RF pulses, the two consecutive RF pulses comprising a target RF pulse and a previous RF pulse, and
   assigning the symbol of the selected response template to the target RF pulse.

7. The system of claim 4,
   wherein comparing the sampled portion of response data comprises generating, for each response template, a difference between the template data of the response template and the sampled portion of response data, the difference defining the degree of fit for the response template; and
   wherein selecting one of the response templates comprises identifying an individual response template that has a minimum difference between its template data and the sampled portion of response data, the individual response template defining the selected response template.

8. The system of claim 1,
   wherein the time series of RF pulses share a pulse period in common;
   wherein the interval is an extended interval during which the vapor experiences two or more transient responses to the target RF electromagnetic field, the extended interval comprising two or more sub-intervals that are associated with respective phase changes in the time series of RF pulses; and
   wherein determining the interval comprises:
   generating a sampled portion of response data by sampling the response data over a sampling period that is based on a multiple number of pulse periods,
   comparing the sampled portion of response data to each of a plurality of response templates to determine respective degrees of fit, each response template having template data that represents a known response of the vapor to a different sequence of reference RF pulses,
   selecting one of the response templates based on its degree of fit, and
   determining the extended interval based on the sampled portion of response data and the template data of the selected response template.

9. The system of claim 8, wherein determining the magnitude of the phase change comprises determining a magnitude of each phase change associated with the two or more sub-intervals based on:
   an extended portion of the response data that is generated during the extended interval; and
   the template data of the selected response template.

10. The system of claim 8,
wherein the plurality of response templates are associated with respective sequences of symbols that are part of a communication protocol;
wherein the time series of RF pulses comprises a sequence of RF pulses in the extended interval; and
wherein the operations of the signal processing system comprise assigning the sequence of symbols of the selected response template to the sequence of RF pulses.

11. The system of claim 1,
wherein the interval is a first interval, and the portion of the response data is a first portion of the response data; and
wherein the operations of the signal processing system comprise:
  determining, based on the response data, a second interval during which the vapor experiences a steady-state response to the target RF electromagnetic field, and
  determining an amplitude of a target RF pulse in the time series of RF pulses based on a second portion of the response data that is generated during the second interval.

12. The system of claim 11,
wherein the phase change in the time series of RF pulses occurs between two consecutive RF pulses in the time series of RF pulses, the two consecutive RF pulses comprising the target RF pulse and a previous RF pulse; and
wherein operations of the signal processing system comprise:
  determining a phase of the target RF pulse based on the magnitude of the phase change and a phase of the previous RF pulse, and
  assigning a symbol to the target RF pulse based on the determined phase and the determined amplitude, the symbol being part of a plurality of symbols of a communication protocol.

13. The system of claim 11,
wherein the time series of RF pulses share a pulse period in common; and
wherein determining the second interval comprises:
  generating a sampled portion of response data by sampling the response data over a sampling period that is based on the pulse period,
  comparing the sampled portion of response data to each of a plurality of response templates to determine respective degrees of fit, each response template having template data that represents a known response of the vapor to a different reference RF pulse,
  selecting one of the response templates based on its degree of fit, and
  determining the second interval based on the sampled portion of response data and the template data of the selected response template.

14. The system of claim 13, wherein determining the amplitude of the target RF pulse comprises determining the amplitude of the target RF pulse based on:
  the second portion of the response data that is generated during the second interval; and
  the template data of the selected response template.

15. The system of claim 1,
wherein the time series of RF pulses share a pulse period in common;
wherein the interval is an extended interval during which the vapor experiences one or more transient responses and one or more steady-state responses to the target RF electromagnetic field, the extended interval comprising:
  one or more first sub-intervals that are associated with respective phase changes in a target sequence of RF pulses, and
  one or more second sub-intervals that are associated with respective amplitudes of the target sequence of RF pulses; and
wherein determining the interval comprises:
  generating a sampled portion of response data by sampling the response data over a sampling period that is based on a multiple number of pulse periods,
  comparing the sampled portion of response data to each of a plurality of response templates to determine respective degrees of fit, each response template having template data that represents a known response of the vapor to a different sequence of reference RF pulses,
  selecting one of the response templates based on its degree of fit, and
  determining the extended interval based on the sampled portion of response data and the template data of the selected response template.

16. The system of claim 15,
wherein determining the magnitude of the phase change comprises determining a magnitude of each phase change associated with the one or more first sub-intervals based on:
  an extended portion of the response data that is generated during the extended interval, and
  the template data of the selected response template; and
wherein the operations of the signal processing system comprise determining each amplitude associated with the one or more second sub-intervals based on:
  the extended portion of the response data, and
  the template data of the selected response template.

17. The system of claim 15,
wherein the plurality of response templates are associated with respective sequences of symbols that are part of a communication protocol; and
wherein the operations of the signal processing system comprise assigning the sequence of symbols of the selected response template to the target sequence of RF pulses.

18. The system of claim 1, wherein generating the response data comprises generating values for respective elements of a density matrix that represents a response of the vapor to the laser signals and the target RF electromagnetic field.

19. The system of claim 1, comprising:
a laser system configured to generate the laser signals;
wherein the operations of the signal processing system comprise transmitting a control signal to the laser system to alter a frequency of one of the laser signals, thereby producing a detuned laser signal whose frequency is detuned relative to an optical electronic transition of the vapor;
wherein the optical signal is based on a transmission of the detuned laser signal through the vapor, and the response data comprises detuned response data that represents the response of the vapor when the laser signals comprise the detuned laser signal; and wherein determining the magnitude of the phase change comprises determining a sign of the phase change based on the detuned response data.

20. The system of claim 19, wherein the detuned laser signal is a first detuned laser signal, and the control signal is a first control signal;

wherein the operations of the signal processing system comprise transmitting a second control signal to the laser system to produce a second detuned laser signal, the second detuned laser signal detuned relative to the optical electronic transition of the vapor; and wherein the detuned response data represents the response of the vapor when the laser signals comprise the first and second detuned laser signals.

21. The system of claim 20, wherein the first and second detuned laser signals have respective frequencies that are symmetrically detuned about the optical electronic transition of the vapor.

22. The system of claim 20, wherein the first and second detuned laser signals have respective frequencies that are asymmetrically detuned about the optical electronic transition of the vapor.

23. The system of claim 1, wherein the laser signals comprise probe and coupling laser signals; and wherein:
 the optical signal is based on a transmission of the probe laser signal through the vapor,
 the probe laser signal is configured to interact with a probe optical transition of the vapor, and
 the coupling laser signal is configured to interact with a coupling optical transition of the vapor.

24. The system of claim 23, wherein the vapor has electronic states that comprise:
 first and second electronic states, and
 first and second Rydberg electronic states;

wherein the first electronic state, the second electronic state, and the first Rydberg electronic state are progressively higher in energy; and wherein:
 the probe optical transition is defined by the first and second electronic states,
 the coupling optical transition is defined by the second electronic state and the first Rydberg electronic state, and
 the Rydberg electronic transition is defined by the first and second Rydberg electronic states.

25. The system of claim 23, wherein the coupling laser signal is a first coupling laser signal, and the coupling optical transition is a first coupling optical transition; and wherein the laser signals comprise a second coupling laser signal that is configured to interact with a second coupling optical transition of the vapor.

26. The system of claim 25, wherein the vapor has electronic states that comprise:
 first, second, and third electronic states, and
 first and second Rydberg electronic states;

wherein the first electronic state, the second electronic state, the third electronic state, and the first Rydberg electronic state are progressively higher in energy; and wherein:
 the probe optical transition is defined by the first and second electronic states,
 the first coupling optical transition is defined by the second electronic state and the third electronic state,
 the second coupling optical transition is defined by the third electronic state and the first Rydberg electronic state, and
 the Rydberg electronic transition is defined by the first and second Rydberg electronic states.

27. The system of claim 1, wherein the laser signals comprise a probe laser signal having comb lines at respective comb frequencies, the comb lines representing different respective detunings of the probe laser signal relative to a probe optical transition of the vapor;

wherein the optical signal is based on a transmission of the probe laser signal through the vapor;

wherein the detector signal represents an intensity of the optical signal at two or more comb frequencies that are associated with respective target comb lines of the probe laser signal; and wherein generating response data comprises generating a subset of response data for each target comb line of the probe laser signal.

28. The system of claim 27, wherein the respective target comb lines of the probe laser signal comprise first and second target comb lines;

wherein determining the interval comprises:
 determining a first interval for the first target comb line based on a first subset of response data that is generated for the first target comb line, the first interval associated with a first phase change in the time series of RF pulses, and
 determining a second interval for the second target comb line based on a second subset of response data that is generated for the second target comb line, the second interval associated with a second phase change in the time series of RF pulses; and wherein determining the magnitude of the phase change comprises:
 determining a magnitude of the first phase change based on a portion of the first subset of response data that is generated during the first interval, and
 determining a magnitude of the second phase change based on a portion of the second subset of response data that is generated during the second interval.

29. The system of claim 1, wherein the laser signals comprise a probe laser signal and a coupling laser signal, the coupling laser signal having comb lines at respective comb frequencies, the comb lines representing different respective detunings of the coupling laser signal relative to a coupling optical transition of the vapor;

wherein the optical signal comprises optical sub-signals that are associated with respective comb lines of the coupling laser signal, the optical sub-signals based on a transmission of the probe laser signal through the vapor as the respective comb lines of the coupling laser signal interact with the vapor;

wherein two or more of the optical sub-signals are associated with respective target comb lines of the coupling laser signal, the two or more optical sub-signals each having an intensity;

wherein the detector signal represents the intensities of the two or more optical sub-signals; and wherein generating response data comprises generating a subset of response data for each target comb line of the coupling laser signal.

30. The system of claim 29,
wherein the time series of RF pulses is a first time series of RF pulses, and the target RF electromagnetic field comprises a second time series of RF pulses, the first and second time series of RF pulses having different carrier frequencies;
wherein the respective target comb lines of the coupling laser signal comprise first and second target comb lines that are associated with, respectively, the first and second time series of RF pulses;
wherein determining the interval comprises:
  determining a first interval for the first target comb line based on a first subset of response data that is generated for the first target comb line, the first interval associated with a first phase change in the first time series of RF pulses, and
  determining a second interval for the second target comb line based on a second subset of response data that is generated for the second target comb line, the second interval associated with a second phase change in the second time series of RF pulses; and
wherein determining the magnitude of the phase change comprises:
  determining a magnitude of the first phase change based on a portion of the first subset of response data that is generated during the first interval, and
  determining a magnitude of the second phase change based on a portion of the second subset of response data that is generated during the second interval.

\* \* \* \* \*

UNITED STATES PATENT AND TRADEMARK OFFICE
CERTIFICATE OF CORRECTION

PATENT NO. : 12,306,237 B2
APPLICATION NO. : 18/825561
DATED : May 20, 2025
INVENTOR(S) : Stephanie M. Bohaichuk et al.

Page 1 of 1

It is certified that error appears in the above-identified patent and that said Letters Patent is hereby corrected as shown below:

In the Drawings

Sheet 5 of 10, Fig. 3C - Delete "54P3/2" and insert --$54P_{3/2}$-- therefor

Sheet 8 of 10, Fig. 5 - Delete "(us)" and insert --(μs)-- therefor

In the Specification

Column 4, Detailed Description, Line 53 - Delete "$\Delta\Delta_{12}$," and insert --$\Delta\sigma_{12}$,-- therefor Column 5, Detailed Description, Line 56 - Delete "208" and insert --200-- therefor Column 6, Detailed Description, Line 1 - Delete "x" and insert --π-- therefor Column 7, Detailed Description, Line 27 - Delete "$53D_{3/2}$," and insert --$53D_{5/2}$,-- therefor Column 10, Detailed Description, Line 53 - Delete "ASICS," and insert --ASICs,-- therefor Column 12, Detailed Description, Line 45 - Delete "I'32" and insert --Γ32-- therefor Column 15, Detailed Description, Line 5 - Delete "MF (t):" and insert --MF(t):-- therefor Column 15, Detailed Description, Line 13 - Delete "MF (t)" and insert --MF(t)-- therefor Column 19, Detailed Description, Line 3 - Delete "310" and insert --308-- therefor Column 19, Detailed Description, Line 38 - Delete "310" and insert --308-- therefor Column 35, Detailed Description, Line 43 - After "periods,", insert --¶--

Signed and Sealed this
Fifth Day of August, 2025

Coke Morgan Stewart
*Acting Director of the United States Patent and Trademark Office*